(12) United States Patent
Tanaka et al.

US010193069B2

(10) Patent No.: US 10,193,069 B2
(45) Date of Patent: Jan. 29, 2019

(54) POLYMER FOR USE IN ORGANIC ELECTROLUMINESCENT ELEMENT AND ORGANIC ELECTROLUMINESCENT ELEMENT EMPLOYING SAME

(75) Inventors: Hiroshige Tanaka, Kitakyushu (JP); Tohru Asari, Kitakyushu (JP); Kazuto Shiraishi, Kitakyushu (JP); Mitsuru Sakai, Kitakyushu (JP); Masashi Niina, Kitakyushu (JP); Kazuaki Yoshimura, Kitakyushu (JP)

(73) Assignee: NIPPON STEEL & SUMIKIN CHEMICAL CO., LTD., Tokyo (JP)

( * ) Notice: Subject to any disclaimer, the term of this patent is extended or adjusted under 35 U.S.C. 154(b) by 621 days.

(21) Appl. No.: 14/118,866

(22) PCT Filed: Jun. 18, 2012

(86) PCT No.: PCT/JP2012/065489
§ 371 (c)(1),
(2), (4) Date: Nov. 19, 2013

(87) PCT Pub. No.: WO2013/002053
PCT Pub. Date: Jan. 3, 2013

(65) Prior Publication Data
US 2014/0084279 A1 Mar. 27, 2014

(30) Foreign Application Priority Data
Jun. 27, 2011 (JP) ................................. 2011-141640

(51) Int. Cl.
*H01L 51/54* (2006.01)
*C09K 11/06* (2006.01)
*H01L 51/00* (2006.01)
*C08G 61/12* (2006.01)
(Continued)

(52) U.S. Cl.
CPC ........ *H01L 51/0035* (2013.01); *C08G 61/124* (2013.01); *C09K 11/06* (2013.01); *H05B 33/22* (2013.01); *C08G 2261/312* (2013.01); *C08G 2261/3162* (2013.01); *C08G 2261/3241* (2013.01); *C08G 2261/344* (2013.01); *C08G 2261/3424* (2013.01); *C08G 2261/364* (2013.01); *C08G 2261/411* (2013.01); *C08G 2261/512* (2013.01); *C08G 2261/95* (2013.01); *C09K 2211/1466* (2013.01); *H01L 51/5012* (2013.01); *H01L 51/5056* (2013.01)

(58) Field of Classification Search
CPC ........ C08G 61/00; C08G 61/02; C08G 61/12; C08G 61/121; C08G 61/122; C08G 61/124; C08G 2261/00; C08G 2261/30; C08G 2261/31; C08G 2261/312; C08G 2261/314; C08G 2261/3162; C08G 2261/3142; C08G 2261/32; C08G 2261/324; C08G 2261/3241; C08G 2261/34; C08G 2261/3424; C08G 2261/344; C08G 2261/364; C08G 2261/411; C08G 2261/512; C08G 2261/95; C09K 11/06; C09K 2211/00; C09K 2211/14; C09K 2211/1441; C09K 2211/1466; H05B 33/22; H01L 51/0032; H01L 51/0034; H01L 51/0035; H01L 51/0039; H01L 51/50; H01L 51/5012; H01L 51/5056; H01L 51/5016
USPC ....... 428/690, 691, 917, 411.4, 336; 427/58, 427/66; 313/500–512; 257/40, 88–104, 257/E51.001–E51.052; 252/301.16–301.35; 528/211, 423
See application file for complete search history.

(56) References Cited

U.S. PATENT DOCUMENTS

2004/0137271 A1 7/2004 Sohn et al.
2006/0149022 A1* 7/2006 Parham ................ C08G 61/124
528/102
2006/0214155 A1 9/2006 Ong et al.
(Continued)

FOREIGN PATENT DOCUMENTS

EP 2 632 747 A1 2/2014
EP 2 692 751 A1 2/2014
(Continued)

OTHER PUBLICATIONS

Supplementary European Search Report for the Application No. EP 12 80 4346 dated Jun. 17, 2015.
(Continued)

*Primary Examiner* — Andrew K Bohaty
(74) *Attorney, Agent, or Firm* — Cheng Law Group, PLLC

(57) ABSTRACT

Provided are a polymer for an organic electroluminescent element, which has improved luminous efficiency and is applicable to a wet process, and an organic electroluminescent element obtained therefrom. The polymer for an organic electroluminescent element has a repeating unit represented by $[-(Z)_l-(A)_m-]_n$ in repeating units constituting a main chain. In addition, the organic electroluminescent element includes, between an anode and a cathode laminated on a substrate, organic layers including a hole-transporting layer and a light-emitting layer, in which at least one of the organic layers contains the polymer for an organic electroluminescent element. In the repeating unit, Z represents an N-indolocarbazolyl group, A represents a repeating unit different from Z, l and m each represent an abundance molar ratio, and l is 5 to 100 mol % and m is 0 to 95 mol %, and n is 2 to 10,000.

14 Claims, 1 Drawing Sheet

(51) Int. Cl.
*H05B 33/22* (2006.01)
*H01L 51/50* (2006.01)

(56) References Cited

U.S. PATENT DOCUMENTS

| | | | |
|---|---|---|---|
| 2007/0060736 A1* | 3/2007 | Becker | C08G 61/02 528/86 |
| 2009/0302742 A1 | 12/2009 | Komori et al. | |
| 2011/0057178 A1 | 3/2011 | Shitagaki et al. | |
| 2011/0198573 A1* | 8/2011 | Iida | C08G 61/12 257/40 |
| 2012/0001158 A1 | 1/2012 | Asari et al. | |

FOREIGN PATENT DOCUMENTS

| | | |
|---|---|---|
| EP | 2 792 699 A1 | 10/2014 |
| JP | 11-256148 A | 9/1999 |
| JP | 2011-71460 A | 4/2011 |
| WO | WO-2010018813 A1 * | 2/2010 ............ C08G 61/12 |
| WO | WO-2011/136755 A1 | 11/2011 |
| WO | WO-2012/087955 A1 | 6/2012 |

OTHER PUBLICATIONS

Akimoto, Masaji et al., "Syntheses and Photonic Properties of Indolocarbazole Derivatives", Transaction of the Materials Research Society of Japan, 2009, vol. 34, No. 1, pp. 141-144.
International Search Report for the Application No. PCT/JP2012/065489 dated Sep. 11, 2012.
English Translation of International Preliminary Report on Patentability (PC171PEN409) for Application No. PCT/JP2012/065489 dated Jul. 2, 2013.
Kido, Junji et al., "Poly(methylphenyisilane) film as a hole transport layer in electroluminescent devices", Applied Physics Letters, Nov. 18, 1991, vol. 59, No. 21, pp. 2760-2762.
Kraft, A. et al., "Hole-Transporting Compounds for Multi-Layer Polymer Light-Emitting Diodes", Synthetic Metals, 1993, vol. 55-57, pp. 4163-4167.

* cited by examiner

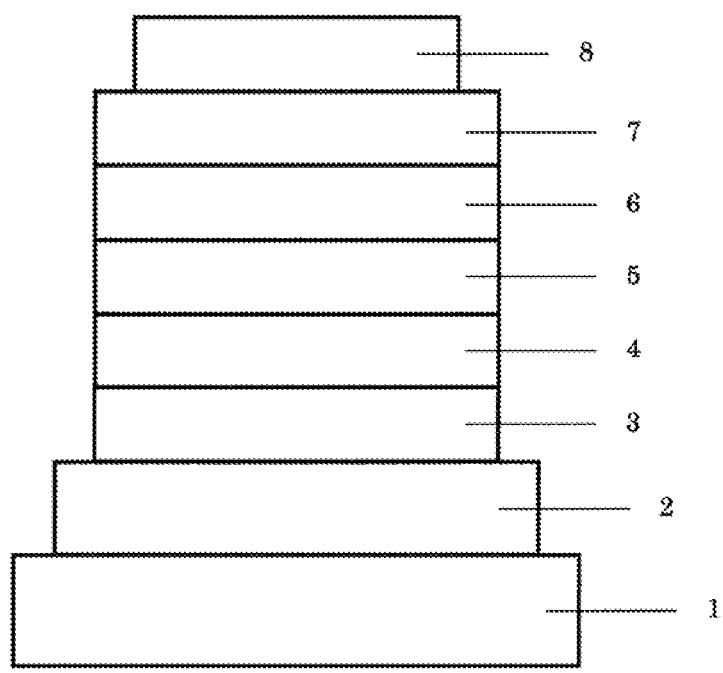

POLYMER FOR USE IN ORGANIC ELECTROLUMINESCENT ELEMENT AND ORGANIC ELECTROLUMINESCENT ELEMENT EMPLOYING SAME

TECHNICAL FIELD

The present invention relates to a polymer for an organic electroluminescent element having a structure which includes an indolocarbazole unit in its main chain, and to an organic electroluminescent element obtained using the polymer.

BACKGROUND ART

In general, an electroluminescent element includes an inorganic electroluminescent element using an inorganic compound in a light-emitting element and an organic electroluminescent element using an organic compound in a light-emitting element. In recent years, active studies on practical realization of the organic electroluminescent element have been made because the element can achieve light emission at a low voltage and at a high luminance.

A basic structure of the organic electroluminescent element is obtained by forming a hole-injecting layer and an organic thin layer such as a light-emitting layer on a glass plate deposited with a thin film of an anode material such as indium-tin oxide (ITO) and further forming a thin film of a cathode material thereon, and there is known an element obtained by appropriately providing a hole-transporting layer or an electron-transporting layer on the basic structure. A construction of layers in the organic electroluminescent element is, for example, anode/hole-injecting layer/light-emitting layer/electron-transporting layer/cathode or anode/hole-injecting layer/hole-transporting layer/light-emitting layer/electron-transporting layer/cathode.

In recent years, it has been found that when a charge-transporting layers such as the hole-injecting layer and the hole-transporting layer are integrated between the light-emitting layer and the anode, the layers improve property of injecting holes into the light-emitting layer and serve as buffer layers which optimize a charge balance to significantly improve luminous efficiency and life of the element.

Hole-transporting materials used in the hole-transporting layer of the organic electroluminescent element are broadly classified into a low-molecular-weight hole-transporting material and a high-molecular-weight hole-transporting material.

As a method of forming the low-molecular-weight hole-transporting material into a film serving as the hole-transporting layer, a vacuum deposition method is mainly used and has the following characteristics. According to the method, it is easy to produce a multilayer using various materials having different functions, which allows a high-performance organic electroluminescent element to be formed. However, there is a problem in that it is difficult to control a thickness uniformly and to apply different materials depending on parts for achieving a large-screen and high-definition panel, and a large-size vacuum apparatus is required, resulting in an increase in production cost.

Further, as the method of forming the low-molecular-weight hole-transporting material into a film serving as the hole-transporting layer, a film formation method involving application of a solution containing the low-molecular-weight hole-transporting material has been studied toward practical use. However, it is necessary to improve this technique for practical use because segregation and phase separation due to crystallization of the low-molecular-weight compound are observed.

On the other hand, as a method of forming the high-molecular-weight hole-transporting material into a film, a solution application method such as a spin coating method, a printing method, or an ink-jet method is used because most of the material cannot be deposited by the vacuum deposition method. This method can easily enlarge a panel screen and is excellent in terms of mass production. However, this method has problems in that it is difficult to laminate coated films, and contamination with impurities is liable to occur. Therefore, an element including the high-molecular-weight hole-transporting material is inferior in element performance such as element efficiency or life as compared with the low-molecular-weight hole-transporting material. Therefore, there has been required a high-molecular-weight hole-transporting material having excellent hole-transporting performance and good film forming property.

As attempts for expressing the required properties, for example, Non Patent Literature 1 discloses polyvinylcarbazole and polysilane, and Patent Literature 2 and Non Patent Literature 2 report polymers having structures in which vinyltriphenylamine and triphenylamine are linked via methylene. However, organic electroluminescent elements including the compounds cannot improve the problems sufficiently because the luminous efficiency and stability of the elements are poor.

In addition, as a technique for enhancing the luminous efficiency of the organic electroluminescent element, a polymer material having a main chain of a π-conjugated polymer including an indolocarbazole unit integrated thereinto, and a light-emitting element including the polymer material have been disclosed. That is, Patent Literature 3 discloses a conjugated polymer obtained by bonding an indolocarbazole at a peripheral position, and Patent Literature 4 discloses a conjugated polymer obtained by introducing an indolocarbazole unit into a polyarylene main chain. However, each of the polymers is a π-conjugated polymer in which an indolocarbazole skeleton is bonded at a peripheral position. Although each of the polymers improves charge mobility, its HOMO energy level is shallow, and hence a difference between the level and the energy level of a host material is large. As a result, hole-injecting property deteriorates. Accordingly, it cannot be said that luminous efficiency has been sufficiently improved.

CITATION LIST

Patent Literature

[PTL 1] JP 05-205377 A
[PTL 2] JP 11-256148 A
[PTL 3] JP 2006-193729 A
[PTL 4] JP 4019042 B2

Non Patent Literature

[NPL 1] Appl. Phys. Lett., 59, 2760 (1995)
[NPL 2] Synthetic Metals, 55-57, 4163, (1993)

SUMMARY OF INVENTION

In order to apply a polymer to an organic electroluminescent element, it is necessary to improve luminous efficiency of the element and to improve stability of a film, solubility in a solvent, and film forming property.

The present invention has been made in view of the above-mentioned problems, and an object of the present invention is to provide a polymer for an organic electroluminescent element, which has high luminous efficiency and is applicable to a wet process. Another object of the present invention is to provide an organic electroluminescent element including the polymer, which is used in a lighting device, an image display device, a back light for a display device, and the like.

The inventors of the present invention have made intensive studies, and as a result, have found that light emission performance can be improved by using conjugated and non-conjugated polymers each having an indolocarbazole skeleton bonded at N-positions, thus completing the present invention.

The present invention relates to a polymer for an organic electroluminescent element containing an indolocarbazole skeleton in its polymer main chain, and an organic electroluminescent element having organic layers between an anode layer and a cathode layer laminated on a substrate, in which at least one of the organic layers contains the polymer.

The present invention relates to a polymer for an organic electroluminescent element, including a repeating unit represented by the following general formula (1) in repeating units constituting a main chain.

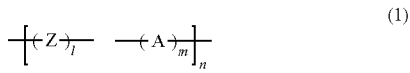

(1)

In the general formula (1), Z represents one or two or more kinds of repeating units selected from groups derived from indolocarbazoles represented by the following formulae (1a) to (1e), A represents a repeating unit different from Z, l and m each represent an abundance molar ratio, and when a ratio of all repeating units is defined as 100 mol %, l is 5 to 100 mol % and m is 0 to 95 mol %, and n represents an average repetition number and is 2 to 10,000.

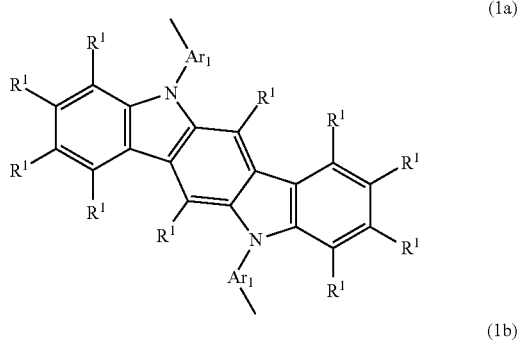

(1a)

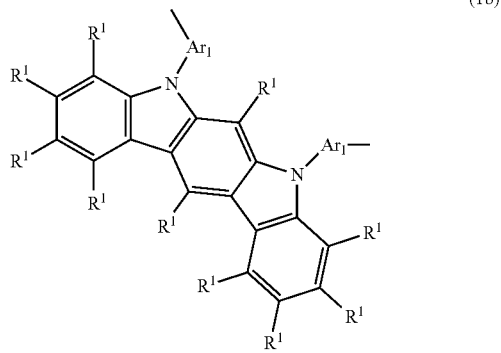

(1b)

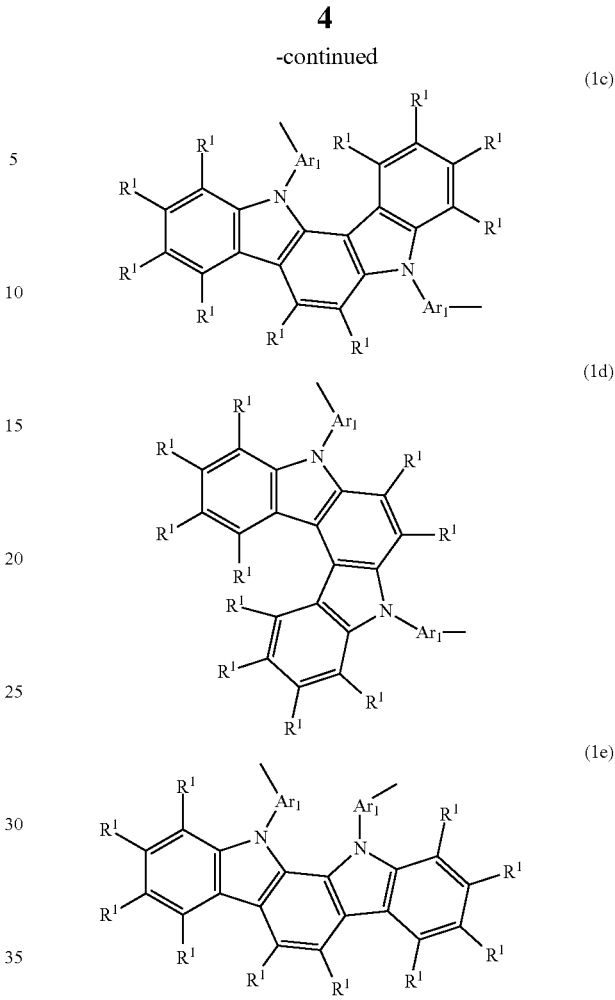

(1c)

(1d)

(1e)

In the formulae (1a) to (1e), $Ar_1$'s each independently represent a substituted or unsubstituted, $C_6$ to $C_{18}$ arylene group, or a substituted or unsubstituted, $C_3$ to $C_{18}$ heteroarylene group, and $R^1$'s each independently represent hydrogen, a $C_1$ to $C_{12}$ alkyl group, a $C_1$ to $C_{12}$ alkoxy group, a $C_6$ to $C_{18}$ aryl group, a $C_6$ to $C_{18}$ aryloxy group, a $C_7$ to $C_{30}$ arylalkyl group, a $C_7$ to $C_{30}$ arylalkyloxy group, a $C_3$ to $C_{18}$ heteroaryl group, a $C_3$ to $C_{18}$ heteroaryloxy group, or a $C_3$ to $C_{18}$ cycloalkyl group.

The present invention relates to the polymer for an organic electroluminescent element, in which in the formulae (1a) to (1e) in the general formula (1), $Ar_1$'s each independently represent a group represented by the following formula (2).

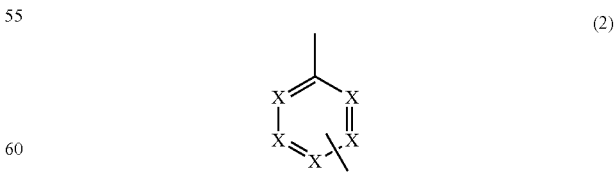

(2)

In the formula (2), X's each independently represent any one of N or C-L, L's each independently represent a hydrogen atom, a $C_6$ to $C_{18}$ aryl group, a $C_3$ to $C_{18}$ heteroaryl group, a $C_{12}$ to $C_{36}$ diarylamino group, or a bonding hand, and one of L's represents a bonding hand.

In addition, the present invention relates to the polymer for an organic electroluminescent element, in which in the general formula (1), A represents a repeating unit represented by the following formula (3).

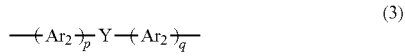

In the formula, $Ar_2$'s each independently represent a substituted or unsubstituted, $C_6$ to $C_{18}$ arylene group, or a substituted or unsubstituted, $C_3$ to $C_{18}$ heteroarylene group, Y represents a $C_1$ to $C_{12}$ alkylene group, O, S, $NR^2$, CO, $CO_2$, SO, $SO_2$, SCO, $NR^2CO$, $CONR^2CO$, or a single bond, p and q each represent an integer of 0 to 3, at least one of p and q represents an integer of 1 or more, and when one of p and q represents 0, Y represents a single bond, and $R^2$ represents a hydrogen atom, a $C_1$ to $C_{12}$ alkyl group, a $C_3$ to $C_{18}$ cycloalkyl group, a $C_6$ to $C_{18}$ aryl group, a $C_7$ to $C_{30}$ arylalkyl group, a $C_3$ to $C_{18}$ heteroaryl group, or a $C_4$ to $C_{30}$ heteroarylalkyl group.

The present invention relates to the polymer for an organic electroluminescent element, in which in the general formula (1), A represents a repeating unit represented by the following formula (4a) or (4b).

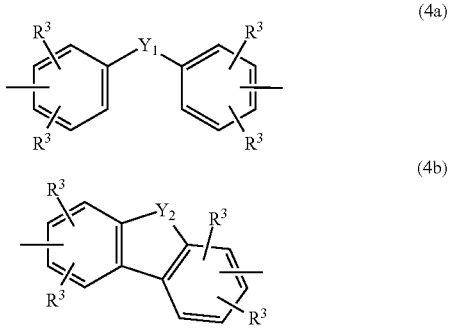

In the formulae, $Y_1$ represents a substituted or unsubstituted, $C_1$ to $C_6$ alkylene group, an N—$R^4$ group, O, S, or a single bond, $Y_2$ represents a C—$(R^4)_2$ group, an N—$R^4$ group, O, or S, $R^3$'s each independently represent a hydrogen atom, a $C_1$ to $C_{12}$ alkyl group, a $C_1$ to $C_{12}$ alkoxy group, a $C_6$ to $C_{18}$ aryl group, a $C_6$ to $C_{18}$ aryloxy group, a $C_7$ to $C_{30}$ arylalkyl group, a $C_7$ to $C_{30}$ arylalkyloxy group, a $C_3$ to $C_{18}$ heteroaryl group, a $C_3$ to $C_{18}$ heteroaryloxy group, or a $C_3$ to $C_{18}$ cycloalkyl group, and $R^4$ represents a hydrogen atom, a $C_1$ to $C_{12}$ alkyl group, a $C_3$ to $C_{18}$ cycloalkyl group, a $C_6$ to $C_{18}$ aryl group, a $C_7$ to $C_{30}$ arylalkyl group, a $C_3$ to $C_{18}$ heteroaryl group, or a $C_4$ to $C_{30}$ heteroarylalkyl group.

The present invention relates to the polymer for an organic electroluminescent element, in which in the general formula (1), the polymer for an organic electroluminescent element has a weight-average molecular weight of 1,000 to 1,000,000. In addition, the present invention relates to the polymer for an organic electroluminescent element, in which in the general formula (1), m representing an abundance molar ratio is 10 to 90 mol %. Further, the present invention relates to the polymer for an organic electroluminescent element, in which the polymer includes an alternating copolymer in which A and Z as repeating units in the general formula (1) are alternately bonded.

The present invention relates to an organic electroluminescent element, including, between an anode layer and a cathode layer laminated on a substrate, organic layers, in which at least one of the organic layers contains the polymer for an organic electroluminescent element. The organic layer containing the polymer for an organic electroluminescent element is, for example, a hole-transporting layer. The organic electroluminescent element is preferably an organic electroluminescent element in which a difference between the HOMO energy of the polymer for an organic electroluminescent element contained in the hole-transporting layer and the HOMO energy of a host material contained in the light-emitting layer containing a guest material and a host material is within ±0.5 eV.

BRIEF DESCRIPTION OF DRAWINGS

The FIGURE is a sectional view illustrating a structure example of an organic EL element.

DESCRIPTION OF EMBODIMENTS

Hereinafter, embodiments of the present invention are described in detail. A polymer for an organic electroluminescent element of the present invention is an oligomer or polymer represented by the general formula (1). In this case, the polymer for an organic electroluminescent element of the present invention may be a homopolymer or a copolymer.

The polymer for an organic electroluminescent element of the present invention has an indolocarbazole skeleton capable of imparting an excellent charge-transporting ability, in particular, a hole-transporting ability in a repeating unit constituting a main chain. In this case, the main chain may be constituted of only one kind of repeating unit or may be constituted of two or more kinds of repeating units, and includes Z as an essential repeating unit and A as an arbitrary repeating unit.

In the general formula (1), n represents a repetition number and is determined by a weight-average molecular weight; the average (number-average) repetition number is 2 to 10,000, preferably 5 to 1,000. l and m represent the abundance ratios of Z and A as repeating units, respectively, and when the ratio of all repeating units is defined as 100 mol %, l representing the abundance ratio of Z is 5 to 100 mol % and m is 0 to 95 mol %. l is preferably 10 to 90 mol %, more preferably 30 to 80 mol %. It should be noted that it is also preferred that l be 100 mol %. m is preferably 10 to 90 mol %, more preferably 20 to 70 mol %.

In addition, the polymer for an organic electroluminescent element of the present invention may include a terminal group except the repeating units Z and A appearing in the general formula (1). The repeating unit A is a repeating unit except the repeating unit Z, and may be one kind, or may be formed of two or more kinds of repeating units.

In the general formula (1), Z represents one or two or more kinds of repeating units selected from groups derived from indolocarbazoles represented by the formulae (1a) to (1e), and any such unit is a divalent group having bonding hands from two $Ar_1$'s bonded to the two N's of an indolocarbazole ring. Hereinafter, the divalent group is sometimes referred to as "indolocarbazolyl group bonded at N-positions." In addition, the indolocarbazolyl group bonded at N-positions can have a substituent at carbon constituting the indolocarbazole ring.

The indolocarbazolyl group bonded at N-positions can adopt five kinds of groups of structural isomers represented by the formulae (1a) to (1e) because the group has a plurality of positions at which an indole ring and a carbazole ring can be condensed. Any one of the structural isomers is permitted.

The indolocarbazolyl group bonded at N-positions represented by Z in the general formula (1) is one or two or more indolocarbazolyl groups selected from the group consisting of structures represented by the formulae (1a) to (1e). When the number of indolocarbazolyl groups is two or more, Z in the general formula (1) is formed of two or more kinds of indolocarbazolyl groups.

In the formulae (1a) to (1e), $Ar_1$ represents a substituted or unsubstituted, $C_6$ to $C_{18}$ arylene group, or a substituted or unsubstituted, $C_3$ to $C_{18}$ heteroarylene group.

Specific examples of the unsubstituted arylene group and heteroarylene group include, but not limited to, a divalent group formed by removing two hydrogen atoms from an aromatic ring of an aromatic compound selected from benzene, pentalene, indene, naphthalene, azulene, heptalene, octalene, indacene, acenaphthylene, phenalene, phenanthrene, anthracene, trindene, fluoranthene, acephenanthrylene, aceanthrylene, triphenylene, pyrene, chrysene, tetraphene, tetracene, pleiadene, picene, perylene, pentaphene, pentacene, tetraphenylene, cholanthrylene, helicene, hexaphene, rubicene, coronene, trinaphthylene, heptaphene, pyranthrene, ovalene, corannulene, fulminene, anthanthrene, zethrene, terrylene, naphthacenonaphthacene, truxene, furan, benzofuran, isobenzofuran, xanthene, oxathrene, dibenzofuran, peri-xanthenoxanthene, thiophene, thioxanthene, thianthrene, phenoxathiin, thionaphthene, isothianaphtene, thiophthene, thiophanthrene, dibenzothiophene, pyrrole, pyrazole, tellurazole, selenazole, thiazole, isothiazole, oxazole, furazan, pyridine, pyrazine, pyrimidine, pyridazine, triazine, indolizine, indole, isoindole, indazole, purine, quinolizine, isoquinoline, carbazole, imidazole, naphthyridine, phthalazine, quinazoline, benzodiazepine, quinoxaline, cinnoline, quinoline, pteridine, phenanthridine, acridine, perimidine, phenanthroline, phenazine, carboline, phenotellurazine, phenoselenazine, phenothiazine, phenoxazine, anthyridine, thebenidine, quindoline, quinindoline, acrindoline, phthaloperine, triphenodithiazine, triphenodioxazine, phenanthrazine, anthrazine, benzothiazole, benzimidazole, benzoxazole, benzisoxazole, or benzisothiazole. Preferred examples thereof include a divalent group formed by removing two hydrogen atoms from an aromatic ring of an aromatic compound selected from benzene, naphthalene, pyridine, pyrazine, pyrimidine, pyridazine, triazine, indole, carbazole, dibenzofuran, or dibenzothiophene.

In addition, the arylene group or the heteroarylene group may have a substituent. In the case of the substituted arylene group or heteroarylene group, the total number of substituents is 1 to 10, preferably 1 to 6, more preferably 1 to 4. The substituent, which is not limited, is preferably, for example, a $C_1$ to $C_{12}$ linear, branched, or cyclic alkyl group, a $C_6$ to $C_{12}$ aryl group, or a $C_3$ to $C_{12}$ heteroaryl group. Specific examples of the substituent include a methyl group, an ethyl group, an n-propyl group, an i-propyl group, an n-butyl group, a t-butyl group, a cyclopentyl group, a cyclohexyl group, a phenyl group, a naphthyl group, a quinolyl group, an indolyl group, a furanyl group, a pyrrolyl group, a thiophenyl group, a pyridyl group, a pyrimidyl group, a triazinyl group, a carbazolyl group, a benzofuranyl group, a dibenzofuranyl group, a benzothiophenyl group, and a dibenzothiophenyl group. When the substituent is an aryl group or a heteroaryl group, the substituent may further have a similar substituent. When the arylene group or the heteroarylene group has two or more substituents, the substituents may be identical to or different from each other. It should be noted that $Ar_1$ represents a divalent group and its two bonding hands in the case where a plurality of aromatic rings are present derive from the same ring or the same fused ring.

In addition, in the formulae (1a) to (1e), $Ar_1$ more preferably represents a divalent group represented by the formula (2). In the formula (2), X's each independently represent any one of N or C-L. It is preferred that 0 to 3 X's each represent N. L's each independently represent a hydrogen atom, a $C_6$ to $C_{18}$ aryl group, a $C_3$ to $C_{18}$ heteroaryl group, a $C_{12}$ to $C_{36}$ diarylamino group, or a bonding hand, and one of L's represents a bonding hand. The bonding hand is one of the two bonding hands appearing in the formula (2).

In this case, preferred examples of the aryl group, the heteroaryl group, and an aryl group in the diarylamino group include: a group formed by removing a hydrogen atom from benzene, pentalene, indene, naphthalene, azulene, heptalene, octalene, indacene, acenaphthylene, phenalene, phenanthrene, anthracene, trindene, fluoranthene, acephenanthrylene, aceanthrylene, triphenylene, pyrene, chrysene, tetraphene, tetracene, pleiadene, picene, perylene, pentaphene, pentacene, tetraphenylene, cholanthrylene, helicene, hexaphene, rubicene, coronene, trinaphthylene, heptaphene, pyranthrene, ovalene, corannulene, fulminene, anthanthrene, zethrene, terrylene, naphthacenonaphthacene, truxene, furan, benzofuran, isobenzofuran, xanthene, oxathrene, dibenzofuran, peri-xanthenoxanthene, thiophene, thioxanthene, thianthrene, phenoxathiin, thionaphthene, isothianaphtene, thiophthene, thiophanthrene, dibenzothiophene, pyrrole, pyrazole, tellurazole, selenazole, thiazole, isothiazole, oxazole, furazane, pyridine, pyrazine, pyrimidine, pyridazine, triazine, indolizine, indole, isoindole, indazole, purine, quinolizine, isoquinoline, carbazole, imidazole, naphthyridine, phthalazine, quinazoline, benzodiazepine, quinoxaline, cinnoline, quinoline, pteridine, phenanthridine, acridine, perimidine, phenanthroline, phenazine, carboline, phenotellurazine, phenoselenazine, phenothiazine, phenoxazine, anthyridine, thebenidine, quindoline, quinindoline, acrindoline, phthaloperine, triphenodithiazine, triphenodioxazine, phenanthrazine, anthrazine, benzothiazole, benzimidazole, benzoxazole, benzisoxazole, or benzisothiazole; a diphenylamino group; and a dinaphthylamino group. More preferred examples thereof include: a group formed by removing a hydrogen atom from benzene, naphthalene, pyridine, pyrazine, pyrimidine, pyridazine, triazine, indole, carbazole, dibenzofuran, or dibenzothiophene; and a diphenylamino group.

In addition, the aryl group, the heteroaryl group, or the aryl group in the diarylamino group may have a substituent. When the group has a substituent, the total number of substituents is 1 to 10, preferably 1 to 6, more preferably 1 to 4. The substituent, which is not particularly limited as long as it does not impair performance, is preferably a $C_1$ to $C_6$ alkyl group, a $C_5$ to $C_{10}$ cycloalkyl group, a $C_6$ to $C_{12}$ aryl group, or a $C_3$ to $C_{12}$ heteroaryl group. Specific examples thereof include a methyl group, an ethyl group, an n-propyl group, an i-propyl group, an n-butyl group, a t-butyl group, a cyclopentyl group, a cyclohexyl group, a phenyl group, a naphthyl group, a quinolyl group, an indolyl group, a furanyl group, a pyrrolyl group, a thiophenyl group, a pyridyl group, a pyrimidyl group, a triazinyl group, a carbazolyl group, a benzofuranyl group, a dibenzofuranyl group, a benzothiophenyl group, and a dibenzothiophenyl group. When the substituent is an aryl group or a heteroaryl group, the substituent may further have a similar substituent.

In addition, in the formulae (1a) to (1e), $R^1$'s each independently represent a hydrogen atom, a $C_1$ to $C_{12}$ alkyl group, a $C_1$ to $C_{12}$ alkoxy group, a $C_6$ to $C_{18}$ aryl group, a $C_6$ to $C_{18}$ aryloxy group, a $C_7$ to $C_{30}$ arylalkyl group, a $C_7$ to $C_{30}$ arylalkyloxy group, a $C_3$ to $C_{18}$ heteroaryl group, a $C_3$ to $C_{18}$ heteroaryloxy group, or a $C_3$ to $C_{18}$ cycloalkyl group, and may be identical to or different from each other. When any such group contains a hydrocarbon chain, the hydrocarbon chain may be linear or branched, and may be substituted with a halogen such as Cl or F. $R^1$'s each represent preferably a hydrogen atom, a $C_1$ to $C_{10}$ alkyl group, a $C_1$ to $C_{10}$ alkoxy group, a $C_6$ to $C_{12}$ aryl group, a $C_6$ to $C_{12}$ aryloxy group, a $C_7$ to $C_{22}$ arylalkyl group, a $C_7$ to $C_{22}$ arylalkyloxy group, a $C_3$ to $C_{12}$ heteroaryl group, a $C_3$ to $C_{12}$ heteroaryloxy group, or a $C_3$ to $C_{12}$ cycloalkyl group, more preferably a hydrogen atom, a $C_1$ to $C_6$ alkyl group, a $C_6$ to $C_{12}$ aryl group, or a $C_3$ to $C_{12}$ heteroaryl group. In addition, any such group may further have a substituent. The substituent, which is not particularly limited as long as it does not impair performance, is preferably a $C_1$ to $C_6$ alkyl group, a $C_5$ to $C_{10}$ cycloalkyl group, a $C_6$ to $C_{12}$ aryl group, or a $C_3$ to $C_{12}$ heteroaryl group. Specific examples thereof include a methyl group, an ethyl group, an n-propyl group, an i-propyl group, an n-butyl group, a t-butyl group, a cyclopentyl group, a cyclohexyl group, a phenyl group, a naphthyl group, a quinolyl group, an indolyl group, a furanyl group, a pyrrolyl group, a thiophenyl group, a pyridyl group, a pyrimidyl group, a triazinyl group, a carbazolyl group, a benzofuranyl group, a dibenzofuranyl group, a benzothiophenyl group, and a dibenzothiophenyl group. When the substituent is an aryl group or a heteroaryl group, the substituent may further have a similar substituent.

In the general formula (1), A represents a repeating unit different from Z, and A is not particularly limited as long as A is formed of a divalent group. A preferably represents a charge-transportable group and a divalent group represented by the formula (3) is preferred as A.

In the formula (3), Y represents a $C_1$ to $C_{12}$ alkylene group, O, S, $NR^2$, CO, $CO_2$, SO, $SO_2$, SCO, $NR^2CO$, $CONR^2CO$, or a single bond, and preferably represents a $C_1$ to $C_{12}$ alkylene group, O, S, $NR^2$, or a single bond. When any such group includes a hydrocarbon chain, the chain may be linear or branched, and may be substituted with a halogen such as Cl or F. In addition, $R^2$ preferably represents a hydrogen atom, a $C_1$ to $C_6$ alkyl group, a $C_6$ to $C_{12}$ aryl group, or a $C_3$ to $C_{12}$ heteroaryl group, and specific examples thereof include a methyl group, an ethyl group, an n-propyl group, an i-propyl group, an n-butyl group, a t-butyl group, a phenyl group, a naphthyl group, a quinolyl group, an indolyl group, a furanyl group, a pyrrolyl group, a thiophenyl group, a pyridyl group, a pyrimidyl group, a triazinyl group, a carbazolyl group, a benzofuranyl group, a dibenzofuranyl group, a benzothiophenyl group, and a dibenzothiophenyl group. When the substituent is an aryl group or a heteroaryl group, the substituent may further have a similar substituent. In addition, p and q each represent an integer of 0 to 3, preferably 0 to 2, provided that when one of p and q represents 0, Y represents a single bond.

In addition, in the formula (3), $Ar_2$'s each independently represent a substituted or unsubstituted, $C_6$ to $C_{18}$ arylene group, or a substituted or unsubstituted, $C_3$ to $C_{18}$ heteroarylene group. Preferred $Ar_2$ is the same as the arylene group or heteroarylene group described for $Ar_1$ in the formulae (1a) to (1e). In addition, the case where the arylene group or the heteroarylene group has a substituent is the same as the description of the substituent for the arylene group or heteroarylene group described for $Ar_1$ in the formulae (1a) to (1e).

The divalent group represented by the formula (3) is more preferably a group represented by one of the formulae (4a) and (4b). $Y_1$ represents a substituted or unsubstituted, $C_1$ to $C_6$ alkylene group, an N—$R^4$ group, O, S, or a single bond, and $Y_2$ represents a C—$(R^4)_2$ group, an N—$R^4$ group, O, or S. $R^3$ is the same as $R^1$ described in the formulae (1a) to (1e). $R^4$ is the same as $R^2$ described in the formula (3). $Y_1$ preferably represents a $C_1$ to $C_3$ alkylene group, O, S, or a single bond because of the following reason: as the chain length of $Y_1$ lengthens, a charge-transporting ability in the repeating unit reduces and the unit becomes thermally unstable. $Y_2$ preferably represents a C—$(R^4)_2$ group, O, or S.

The polymer for an organic electroluminescent element of the present invention having an indolocarbazole ring in its main chain can be easily produced by: producing a monomer that provides the repeating unit Z, or the repeating units Z and A; and polymerizing the monomer by a known method. For example, the polymer can be produced by the following reaction formulae. Although each of polycondensation and addition polymerization is available as a method for the polymerization, polycondensation based on the Suzuki coupling reaction is desirable from a general-purpose viewpoint.

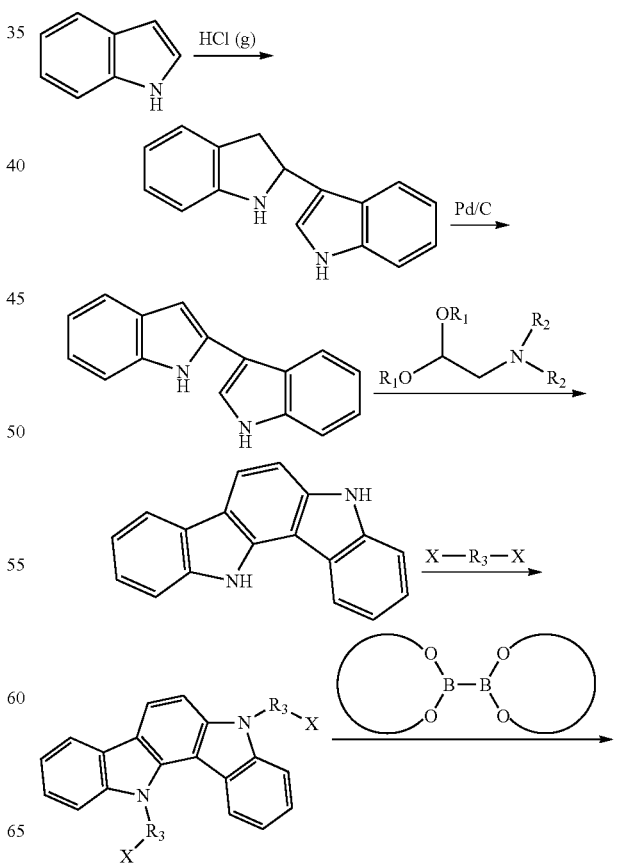

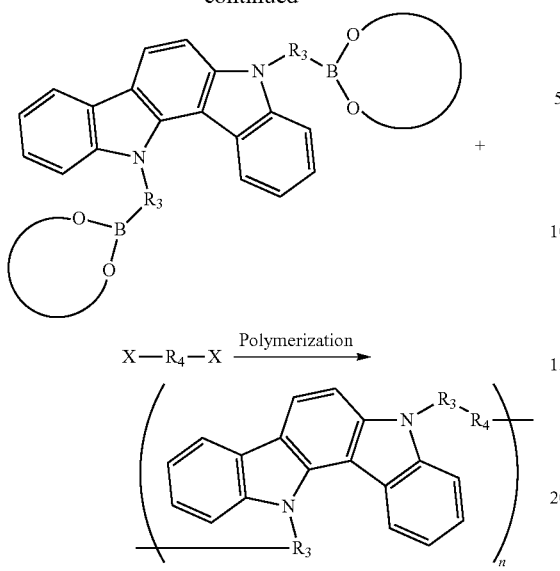

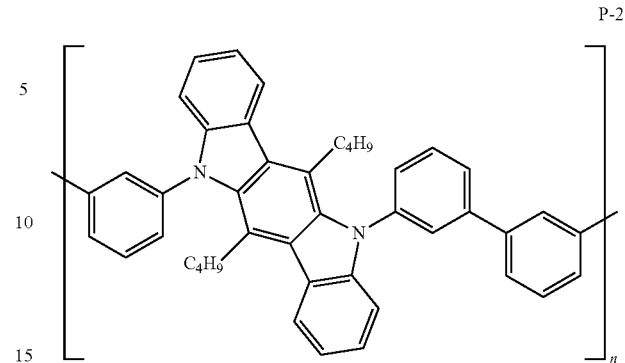

The reaction example is an example in which in the general formula (1), the repeating unit Z is a divalent group in which the two N's of an indolocarbazole are each substituted with $R_3$, A is $R_4$, and Z and A are alternately bonded to form a repeating unit. The abundance ratios l and m in the general formula (1) can be controlled by controlling the kind and molar ratio of a halogen compound involved in the polymerization reaction. It should be noted that X in the reaction example means a halogen.

The indolocarbazole-based polymer of the present invention has a weight-average molecular weight Mw of 1,000 to 1,000,000, preferably 2,000 to 300,000. When the Mw is less than 1,000, formation of a uniform film is difficult, while when the Mw is more than 1,000,000, solubility in an organic solvent is extremely poor, resulting in difficulty in application of a solution.

Hereinafter, examples of the polymer having an indolocarbazole skeleton of the present invention are shown, but the polymer is not limited thereto.

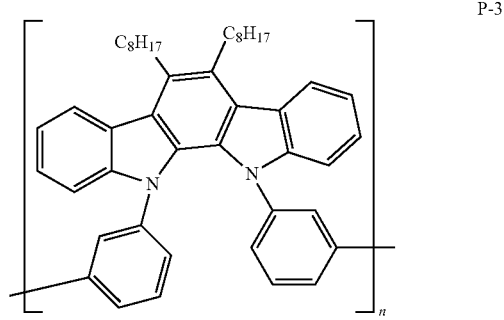

P-3

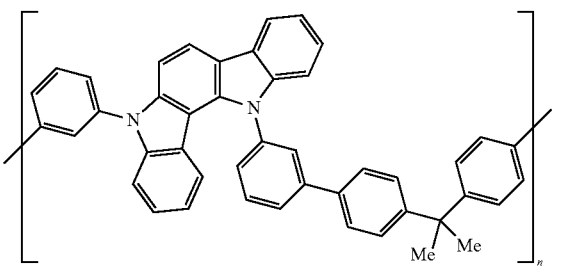

P-4

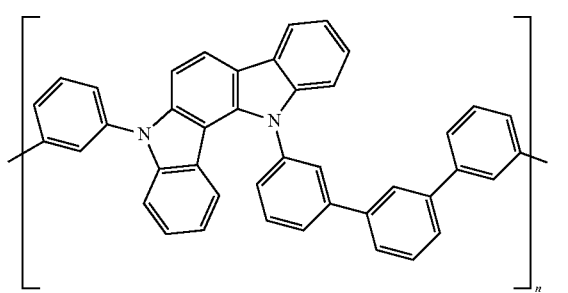

P-5

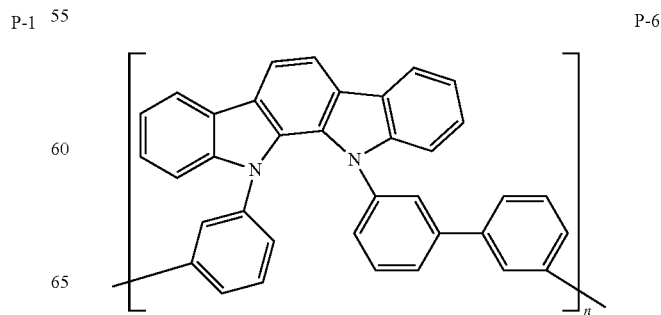

P-6

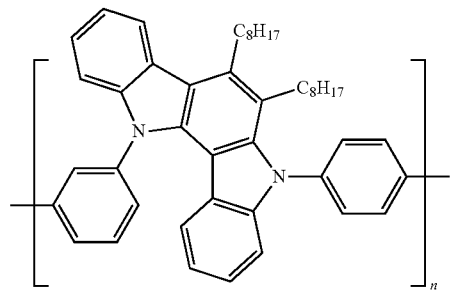

P-1

P-7
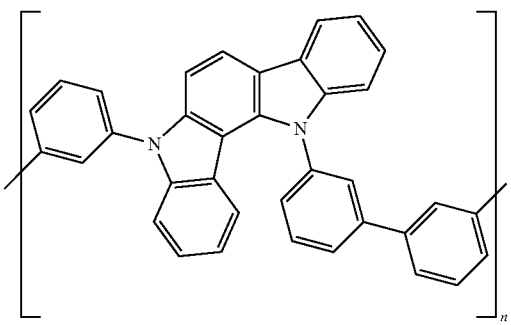
P-8
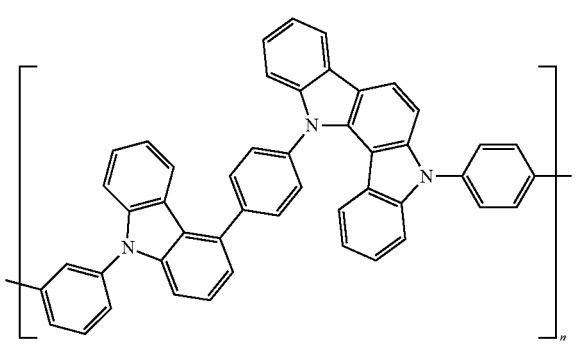
P-9
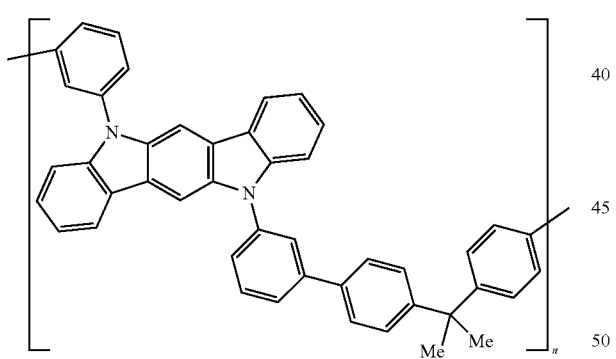
P-10
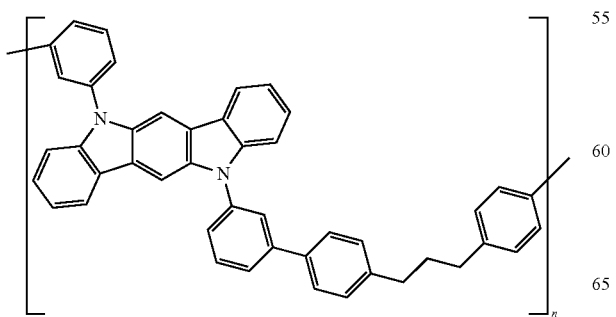
P-11
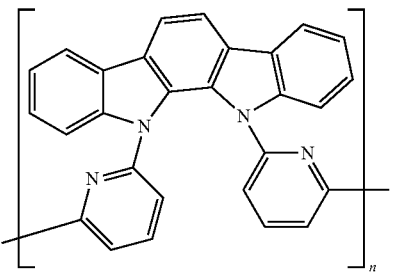
P-12
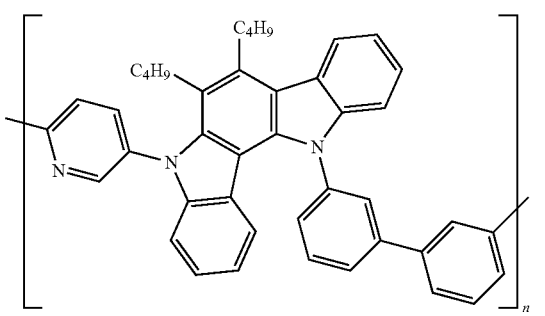
P-13
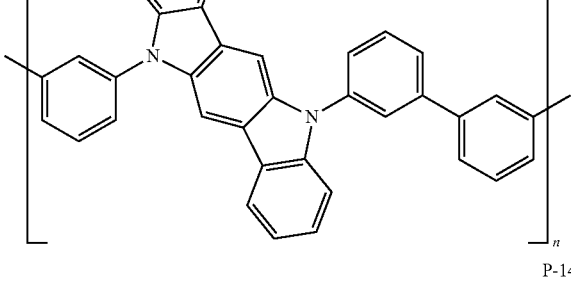
P-14
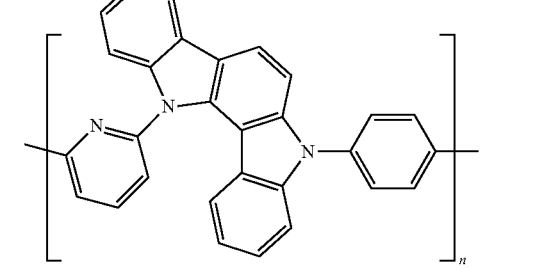
P-15
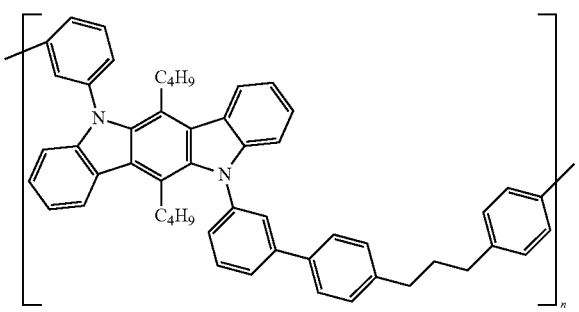

P-16
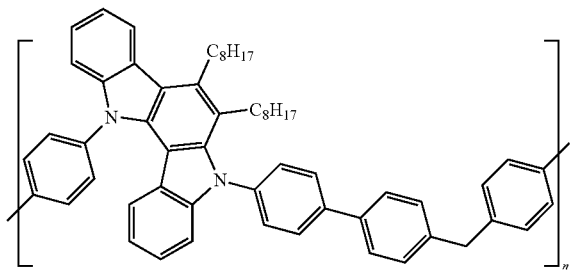
P-17
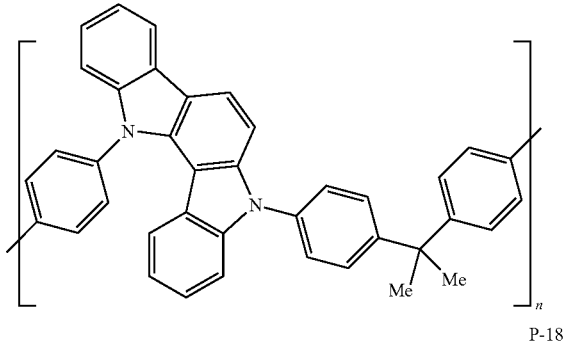
P-18
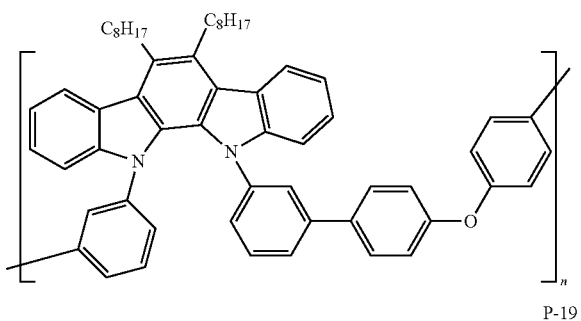
P-19
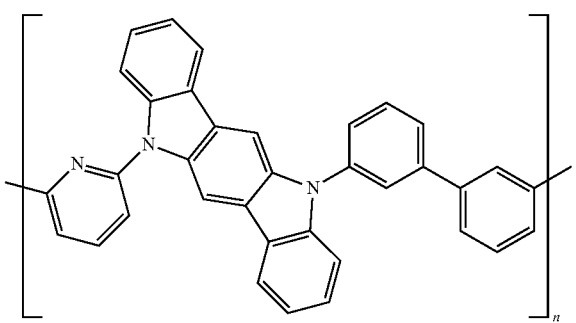
P-20
P-21
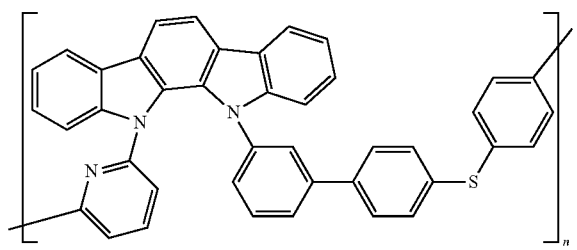
P-22
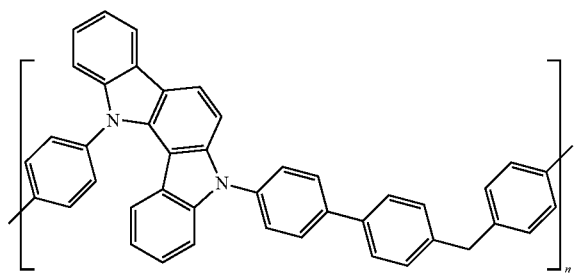
P-23
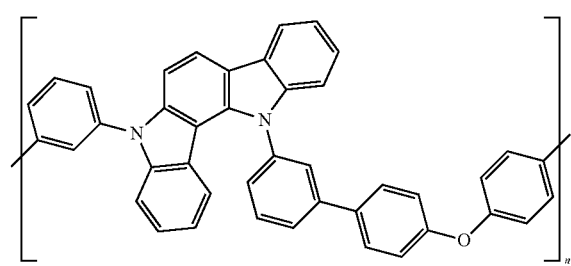
P-24
P-25
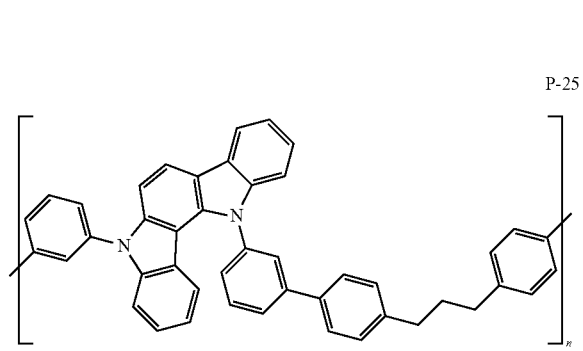

P-26 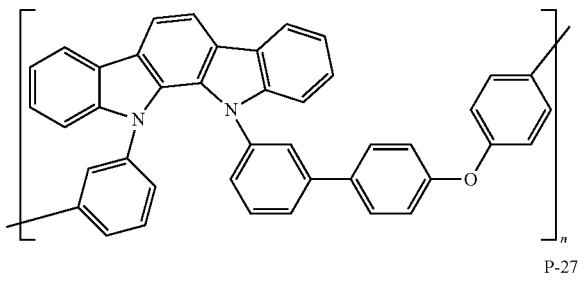
P-31 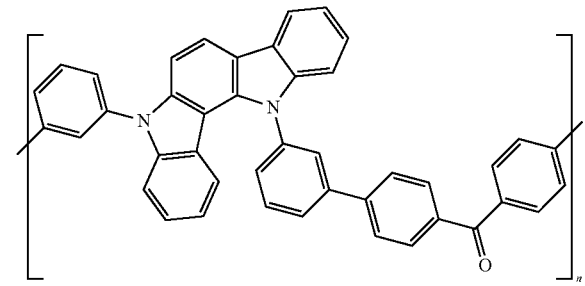
P-27 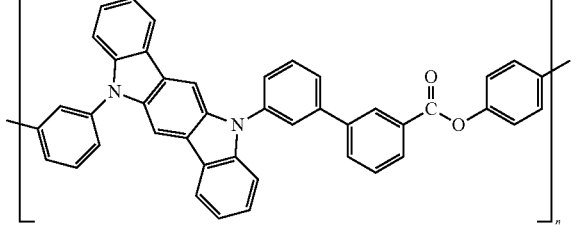
P-32 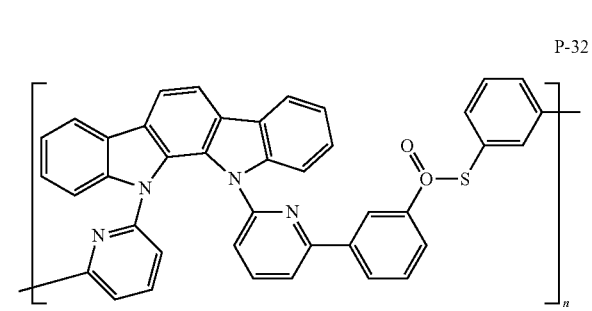
P-28 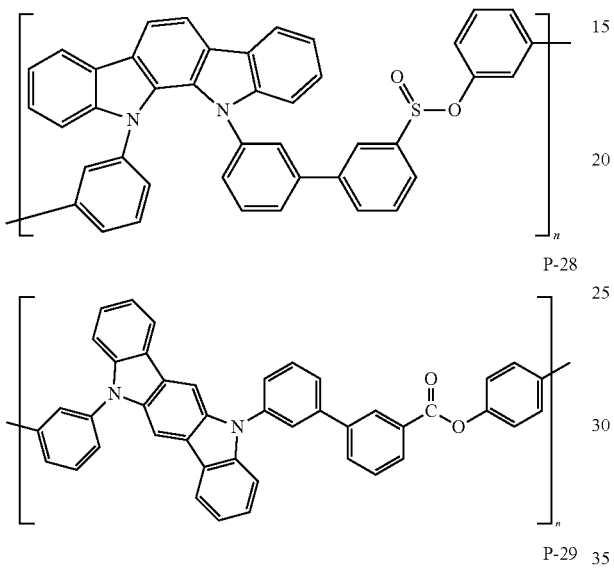
P-33 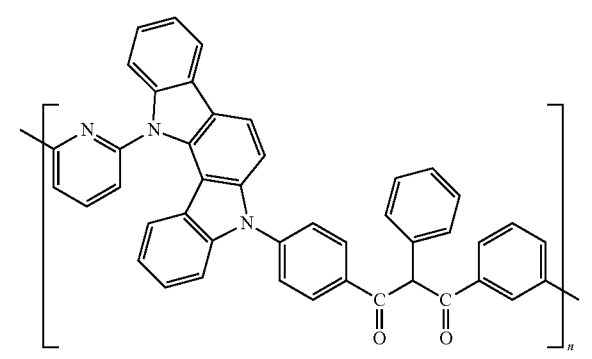
P-29 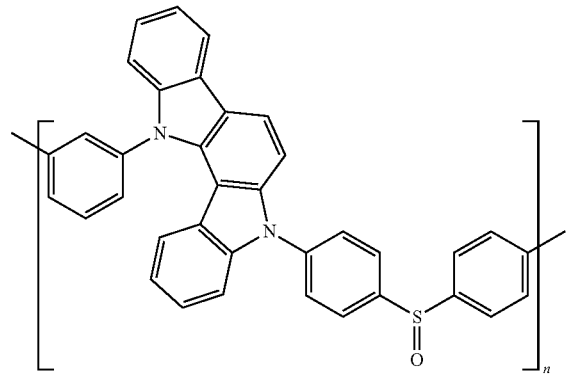
P-34 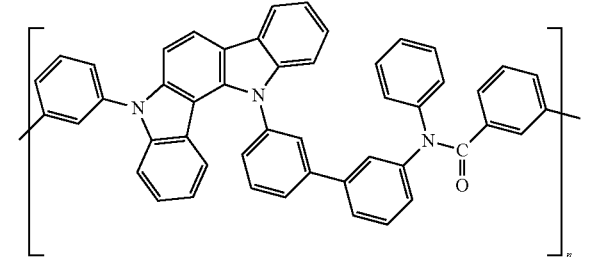
P-30 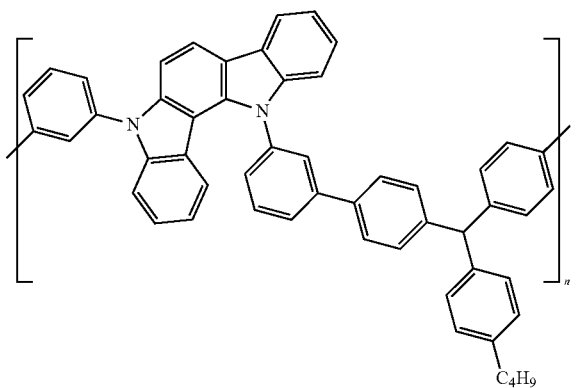
P-35 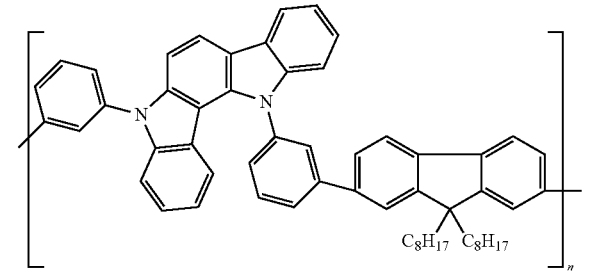

-continued
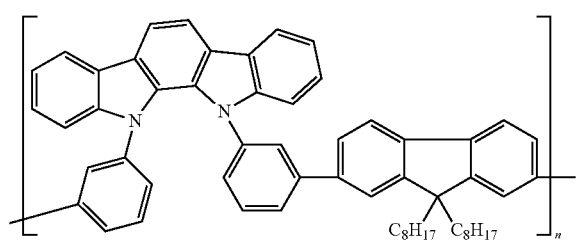
P-36
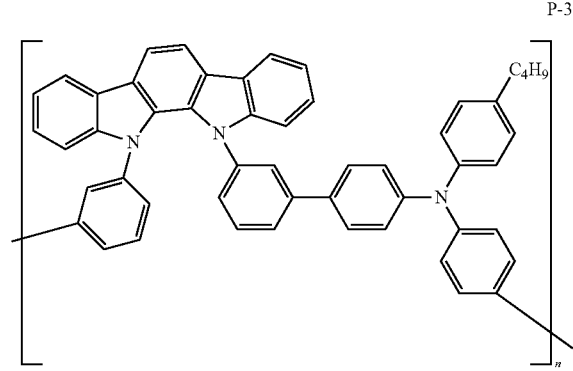
P-37
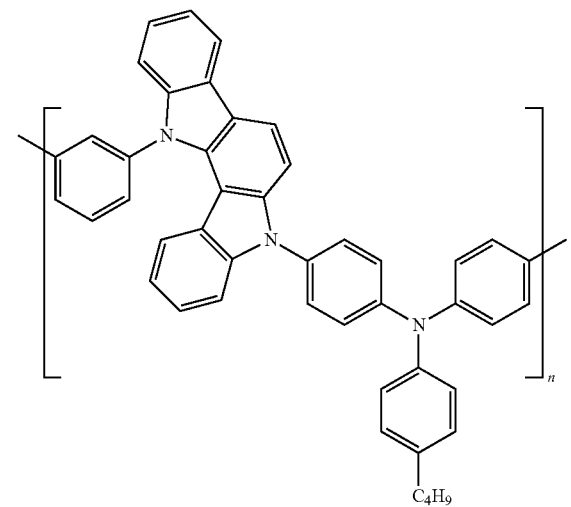
P-38
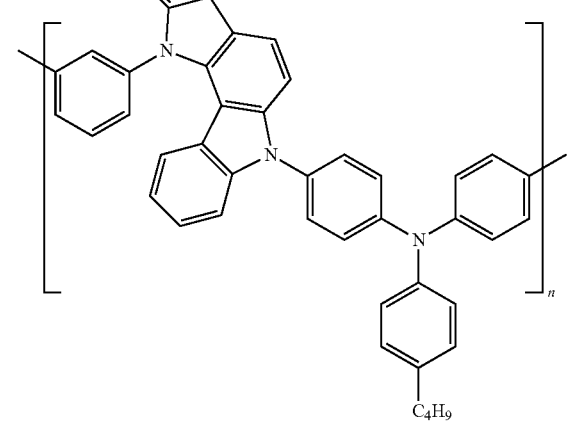
P-39
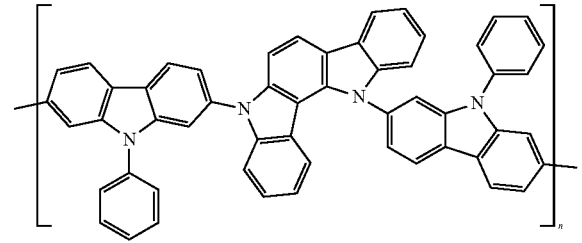
P-40
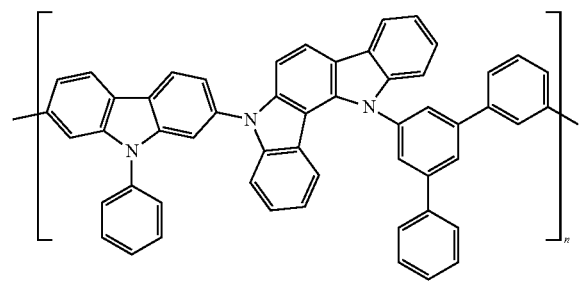
P-41
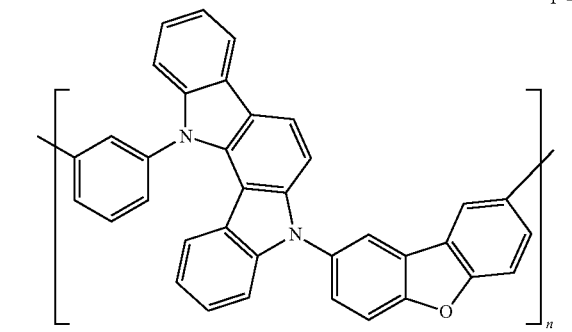
P-42
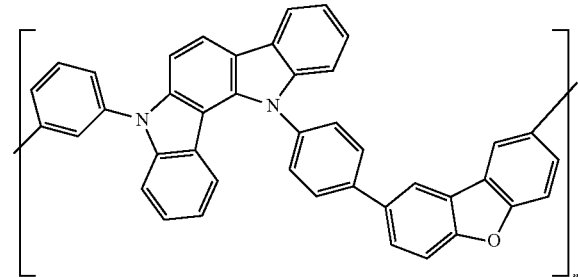
P-43
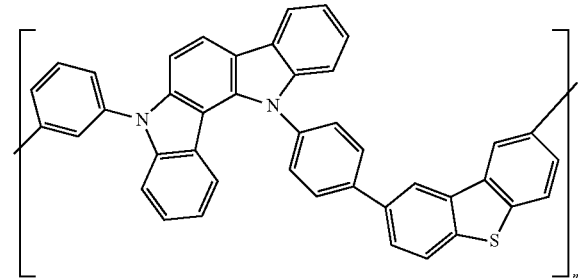
P-44
It should be noted that the polymer for an organic electroluminescent element of the present invention may be a homopolymer or a copolymer. In the case where the polymer for an organic electroluminescent element is a copolymer, polymerization may be carried out in a random manner, in a block manner, or in an alternating manner. However, the polymerization is preferably carried out in an alternating manner as shown in the formula.

In addition, an excellent organic electroluminescent element is obtained by incorporating the polymer for an organic electroluminescent element of the present invention into an organic layer of the organic EL element. The polymer is preferably incorporated into at least one organic layer selected from a light-emitting layer, a hole-transporting layer, an electron-transporting layer, and a hole-blocking layer, and more preferably incorporated into a hole-transporting layer. The light-emitting layer is preferably a fluorescent or phosphorescent light-emitting layer containing a host material and a guest material, more preferably a phosphorescent light-emitting layer.

When the polymer for an organic electroluminescent element of the present invention is incorporated into the hole-transporting layer, a difference between its HOMO energy and the HOMO energy of the host material incorporated into the light-emitting layer adjacent to the hole-transporting layer is preferably as small as possible. In addition, when the adjacent light-emitting layer contains a plurality of compounds, a difference in HOMO energy between the polymer and a compound serving as a main component for the light-emitting layer is preferably as small as possible. The difference between the HOMO energy of the polymer for an organic electroluminescent element and the HOMO energy of the compound in the light-emitting layer (when the layer contains the host material and the guest material, the compound is a compound serving as the host material as the main component) is desirably within ±0.5 eV, preferably within ±0.3 eV. When the difference between the HOMO energy of the polymer for an organic electroluminescent element and the HOMO energy of the compound in the light-emitting layer deviates from ±0.5 eV, hole-injecting property deteriorates and hence luminous efficiency reduces.

It should be noted that values for the LUMO energy and HOMO energy as used herein are values determined using software for molecular orbital calculation, Gaussian03, manufactured by Gaussian, Inc., USA, and are defined as values calculated by structure optimization calculation at the B3LYP/6-31G* level. In the calculation for the polymer, values for a trimer and higher multimers are similar to each other. Thus, the calculation was performed for the trimer.

Next, a structure of the organic EL element of the present invention is described with reference to the drawings. However, the structure of the organic EL element of the present invention is by no means limited to one illustrated in the FIGURE.

The FIGURE is a sectional view schematically illustrating a structure example of a general organic EL element to be used in the present invention. In the FIGURE, a substrate is represented by 1, an anode is represented by 2, a hole-injecting layer is represented by 3, a hole-transporting layer is represented by 4, an electron- and/or exciton-blocking layer (EB layer) is represented by 5, a light-emitting layer is represented by 6, an electron-transporting layer is represented by 7, and a cathode is represented by 8. The organic EL element of the present invention has, as essential layers, an anode, a hole-transporting layer, a light-emitting layer, and a cathode. The organic EL element preferably has an anode, a hole-transporting layer, a light-emitting layer, an electron-transporting layer, and a cathode.

Further, the organic EL element of the present invention may have, as layers other than the essential layers, an electron-transporting layer, an electron-injecting layer, an EB layer, and a hole-blocking layer. In addition, the hole-transporting layer may be a hole-injecting/transporting layer having a hole-injecting function and the electron-transporting layer may be an electron-injecting/transporting layer having an electron-injecting function.

It should be noted that the organic EL element of the present invention may have an structure opposite to that illustrated in the FIGURE, that is, the cathode 8, the electron-transporting layer 7, the light-emitting layer 6, the EB layer 5, the hole-transporting layer 4, and the anode 2 may be laminated on the substrate 1 in the stated order. Also in this case, a layer may be added or omitted, as necessary.

Hereinafter, the respective members and the respective layers are described.

—Substrate—

The organic EL element of the present invention is preferably supported by a substrate. The substrate is not particularly limited and may be any substrate which is conventionally used in an organic EL element. For example, a substrate formed of glass, transparent plastic, quartz, or the like may be used.

—Light-Emitting Layer—

The light-emitting layer is a layer containing a light-emitting material, and may be any one of a fluorescent light-emitting layer and a phosphorescent light-emitting layer. Of those, a phosphorescent light-emitting layer is preferred.

When the light-emitting layer is a fluorescent light-emitting layer, although at least one kind of fluorescent light-emitting material may be used alone as a fluorescent light-emitting material, it is preferred that the fluorescent light-emitting material be used as a fluorescent light-emitting dopant and the host material be incorporated.

Although the polymer for an organic electroluminescent element represented by the general formula (1) can be used as the fluorescent light-emitting material in the light-emitting layer, when the compound is used in any other organic layer, the fluorescent light-emitting material can be selected from those known from many patent literatures and the like. Examples thereof include: a benzoxazole derivative, a benzimidazole derivative, a benzothiazole derivative, a styrylbenzene derivative, a polyphenyl derivative, a diphenylbutadiene derivative, a tetraphenylbutadiene derivative, a naphthalimide derivative, a coumarin derivative, a fused aromatic compound, a perinone derivative, an oxadiazole derivative, an oxazine derivative, aldazine derivative, a pyrrolidine derivative, cyclopentadiene derivative, a bis-styrylanthracene derivative, a quinacridone derivative, a pyrrolopyridine derivative, a thiadiazolopyridine derivative, a cyclopentadiene derivative, a styrylamine derivative, a diketopyrrolopyrrole derivative, and an aromatic dimethylidyne compound; various metal complexes typified by a metal complex of an 8-quinolinol derivative and a metal complex, rare earth metal complex, or transition metal complex of a pyrromethene derivative; polymer compounds such as polythiophene, polyphenylene, and polyphenylene vinylene; and an organic silane derivative. Preferred examples thereof include a fused aromatic compound, a styryl compound, a diketopyrrolopyrrole compound, an oxazine compound, a metal complex, transition metal complex, or lanthanoid complex of pyrromethene. More preferred examples thereof include naphthacene, pyrene, chrysene, triphenylene, benzo[c]phenanthrene, benzo[a]anthracene, pentacene, perylene, fluoranthene, acenaphthofluoranthene, dibenzo[a,j]anthracene, dibenzo[a,h]anthracene, benzo[a]naphthacene, hexacene, anthanthrene, naphtho[2,1-f]isoquinoline, α-naphthaphenanthridine, phenanthroxazole, quinolino[6,5-f]quinoline, and benzothiophanthrene. Any such material may have an aryl group, a heteroaryl group, a diarylamino group, or an alkyl group as a substituent.

When the fluorescent light-emitting material is used as a fluorescent light-emitting dopant and the host material is incorporated, the amount of the fluorescent light-emitting dopant to be incorporated into the light-emitting layer desirably falls within the range of 0.01 to 20 wt %, preferably 0.1 to 10 wt %.

In ordinary cases, an organic EL element is caused to emit light by injecting charge from each of both electrodes, i.e., an anode and a cathode into a light-emitting substance to produce a light-emitting substance in an excited state. It has been said that in the case of a charge injection type organic EL element, 25% of produced excitons are excited to an excited singlet state and the remaining 75% are excited to an excited triplet state. As described in Applied Physics Letters 98, 83302 (2011), it has been known that after the transition of its energy into an excited triplet state through intersystem crossing or the like, a specific fluorescent light-emitting substance undergoes inverse intersystem crossing into an excited singlet state by virtue of triplet-triplet annihilation or the absorption of a thermal energy to radiate fluorescence, thereby expressing thermally activated delayed fluorescence. An organic EL element using the compound of the present invention can also express delayed fluorescence. In this case, the delayed fluorescence can include both fluorescent emission and delayed fluorescent emission; provided that light emission from the host material may be partially present in the light emission.

Meanwhile, a phosphorescent light-emitting dopant and a host material are incorporated as a phosphorescent light-emitting material. The phosphorescent light-emitting dopant material is preferably a material containing an organic metal complex including at least one metal selected from ruthenium, rhodium, palladium, silver, rhenium, osmium, iridium, platinum, and gold. Such organic metal complex is known in many patent literatures and the like, and it is possible to select and use the complex.

Examples of the phosphorescent light-emitting material for providing high luminous efficiency include complexes such as $Ir(ppy)_3$, complexes such as $Ir(bt)_2 \cdot acac_3$, and complexes such as $PtOEt_3$, the complexes each having a noble metal element such as Ir as a central metal. Hereinafter, the phosphorescent light-emitting material is specifically exemplified below, but is not limited thereto.

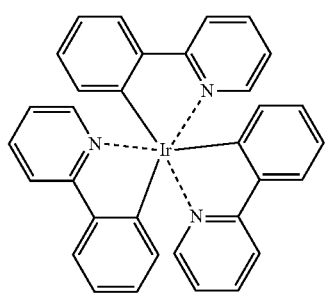

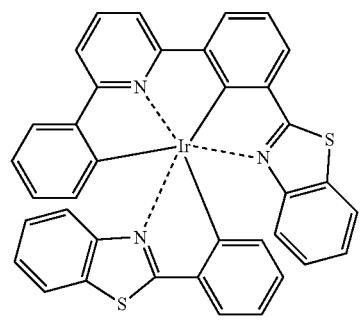

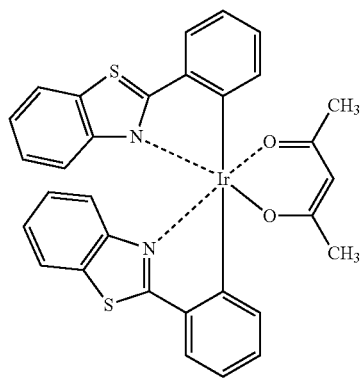

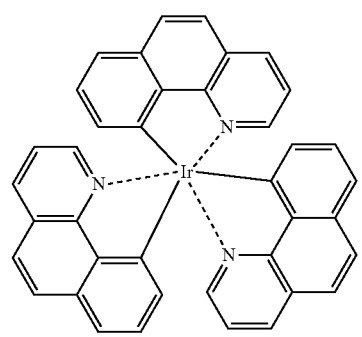

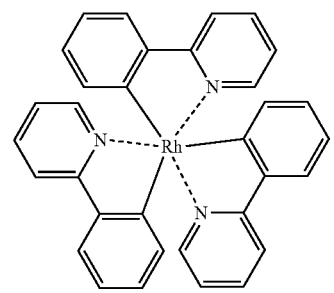

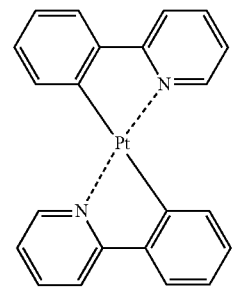

-continued

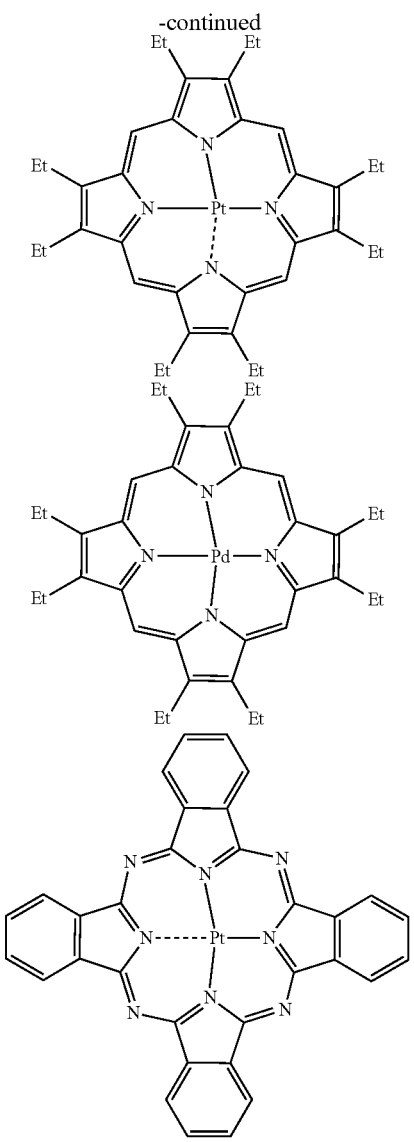

Organic electroluminescent elements having various emission wavelengths may be produced by using different kinds of light-emitting materials.

In the case where the above-mentioned light-emitting material is used as a dopant, the amount of the material in the light-emitting layer falls within the range of preferably 1 to 50 wt %, more preferably 5 to 30 wt %.

As the host material in the light-emitting layer, a known host material may be used, and the polymer of the present invention may be used as the host material. Further, the polymer of the present invention may be used in combination with another host material.

It is preferred to use, as a usable known host compound, a compound that has a hole-transporting ability and an electron-transporting ability, is capable of preventing luminescence from having a longer wavelength, and has a higher glass transition temperature.

Such other host materials are known in many patent literatures and the like, and hence a suitable host material may be selected therefrom. Specific examples of the host material include, but not limited to, an indole derivative, a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidene-based compound, a porphyrin-based compound, an anthraquinodimethane derivative, an anthrone derivative, a diphenylquinone derivative, a thiopyran dioxide derivative, a heterocyclic tetracarboxylic acid anhydride derived from naphthalene, perylene, or the like, a phthalocyanine derivative, various metal complexes typified by a metal complex of an 8-quinolinol derivative, a metal phthalocyanine, and metal complexes of benzoxazole and benzothiazole derivatives, and polymer compounds such as a polysilane-based compound, a poly(N-vinylcarbazole) derivative, an aniline-based copolymer, a thiophene oligomer, a polythiophene derivative, a polyphenylene derivative, a polyphenylene vinylene derivative, and a polyfluorene derivative.

—Hole-Transporting Layer—

As a hole-transporting compound for forming the hole-transporting layer, the polymer for an organic electroluminescent element of the present invention is advantageously used. Examples thereof include a derivative of triphenylamine as a tertiary amine and a carbazole derivative, as required, as long as the object of the present invention is not impaired. One kind or two or more kinds of low-molecular-weight hole-transporting compounds may be blended as additives to produce a composition. The hole-transporting compound is specifically exemplified below, but is not limited thereto.

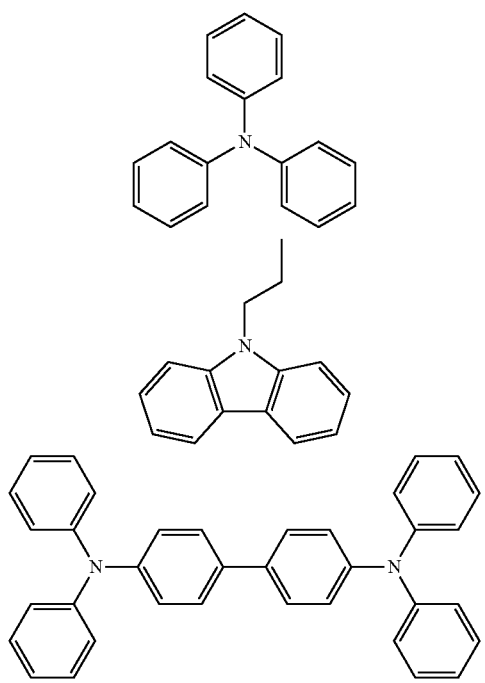

-continued

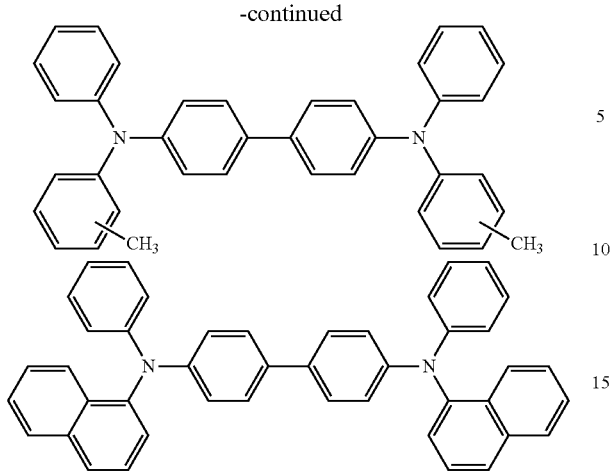

—Electron-Blocking Layer—

An electron-blocking layer has a role in blocking electrons from reaching the hole-transporting layer while transporting holes. This can improve the probability of recombination of electrons and holes in the light-emitting layer. As a material for the electron-blocking layer, is given.

—Exciton-Blocking Layer—

The exciton-blocking layer refers to a layer for blocking excitons, which are generated by the recombination of holes and electrons in the light-emitting layer, from diffusing to a charge-transporting layer. The insertion of this layer allows excitons to be efficiently confined in the light-emitting layer, which can improve the luminous efficiency of an element. The exciton-blocking layer may be inserted on any one of the anode side and the cathode side of the adjacent light-emitting layer, and may be simultaneously inserted on both of the sides. That is, when the exciton-blocking layer is provided on the anode side, the layer may be inserted between the hole-transporting layer and the light-emitting layer so as to be adjacent to the light-emitting layer. When the exciton-blocking layer is inserted on the cathode side, the layer may be inserted between the light-emitting layer and the cathode so as to be adjacent to the light-emitting layer. Further, the hole-injecting layer, the electron-blocking layer, and the like may be provided between the anode and the exciton-blocking layer adjacent to the anode side of the light-emitting layer, and the electron-injecting layer, the electron-transporting layer, the hole-blocking layer, and the like may be provided between the cathode and the exciton-blocking layer adjacent to the cathode side of the light-emitting layer.

A usable known material for the exciton-blocking layer is exemplified by 1,3-dicarbazolylbenzene (mCP) or bis(2-methyl-8-quinolinolato)-4-phenylphenolatoaluminum (III) (BAlq).

—Electron and/or Exciton-Blocking Layer (EB Layer)—

The EB layer is an electron-blocking layer, an exciton-blocking layer, or a layer having functions of both the layers, and a material for forming the EB layer is, for example, 1,3-dicarbazolylbenzene (MCP).

—Electron-Transporting Layer—

Examples of the electron-transporting compound for forming the electron-transporting layer include an oxadiazole derivative, an imidazole derivative, and a triazole derivative. As required, one kind or two or more kinds of low-molecular-weight electron-transporting compounds may be blended as additives to produce a composition as long as the object of the present invention is not impaired. The electron-transporting compound is specifically exemplified below, but is not limited thereto.

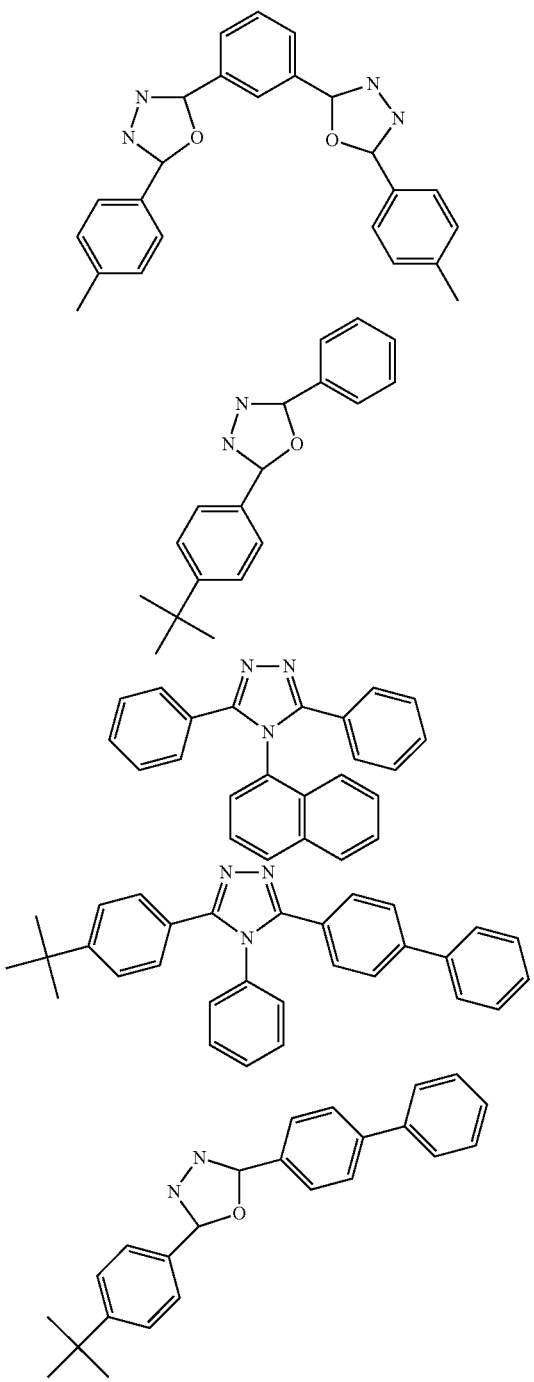

—Hole-Injecting Layer—

In order to improve efficiency of hole injection from the anode, the hole-injecting layer may be inserted between the anode and the hole-transporting layer or the light-emitting layer. As a hole-injecting material for forming the hole-injecting layer, a conductive polymer such as a polythiophene derivative or a polypyrrole derivative may be used. Of those, poly(3,4-ethylenedioxythiophene)/polystyrene sulfonic acid (PEDOT/PSS) as a polythiophene derivative is preferred in view of the efficiency of hole injection. In the case of using the hole-injecting layer, the thickness thereof is preferably 200 nm or less, more preferably 100 nm or less.

—Anode—

The anode supplies holes to the hole-injecting layer, the hole-transporting layer, the light-emitting layer, or the like, and is generally formed on a glass substrate. The material for the anode used in the present invention is not particularly limited, and specific examples thereof include a conductive metal oxide such as indium-tin oxide (ITO) or tin oxide, and a metal such as gold, silver, or platinum. Further, a commercially available glass with ITO may be used. The commercially available glass with ITO is usually washed with a cleaner aqueous solution and a solvent, and cleaned by a UV ozone irradiation apparatus or a plasma irradiation apparatus before use.

—Cathode—

The cathode supplies electrons to the electron-transporting layer or the light-emitting layer. The material for the anode used in the present invention is not particularly limited, and specific examples thereof include a metal such as Li, Mg, Ca, or Al, and an alloy thereof such as an Mg—Ag alloy or an Mg—Al alloy.

The cathode and anode can be formed by a known method, i.e., a vacuum deposition method or a sputtering method. The thickness of the cathode is preferably 300 nm or less, more preferably 200 nm or less, while the thickness of the anode is preferably 200 nm or less, more preferably 100 nm or less.

EXAMPLES

Hereinafter, the present invention is specifically described by way of examples. However, the present invention is not limited to these examples.

Compounds synthesized in the examples were identified by one kind or more kinds of analysis methods selected from $^1$H-NMR (solvent: deuterated chloroform), FD-MS, GPC, TGA, DSC, UV, and IR analyses.

Example 1

According to the following scheme, a compound (A-2) and a compound (B-4) are synthesized, and then a polymer (P-1) is synthesized.

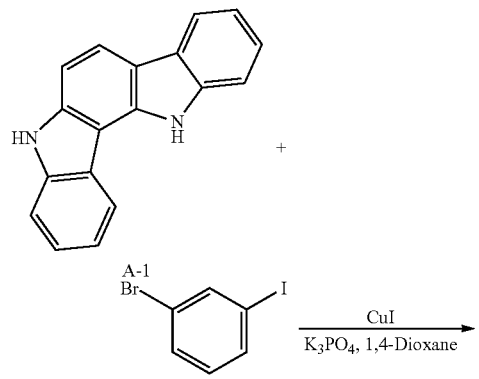

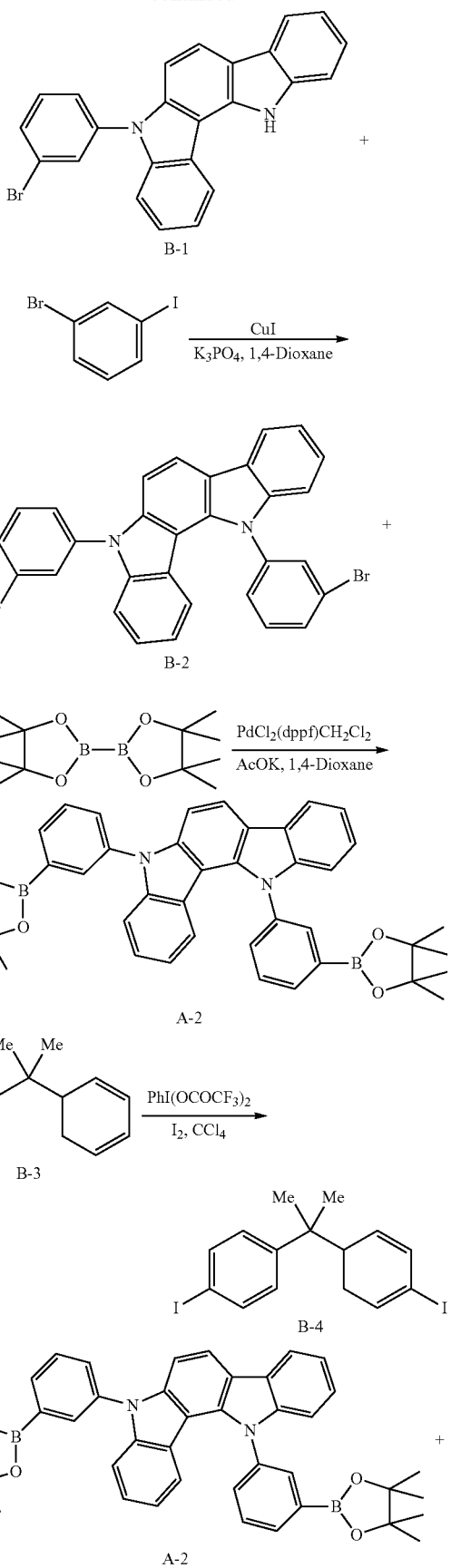

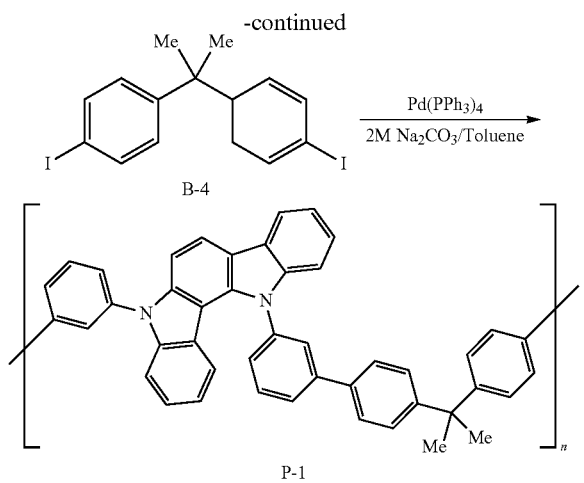

Under a nitrogen atmosphere, 10.00 g (39.1 mmol) of a compound (A-1), 12.2 g (42.9 mmol) of 1-bromo-3-iodobenzene, 0.24 g (1.2 mmol) of copper iodide, 33.2 g (156.3 mmol) of tripotassium phosphate, and 200 ml of 1,4-dioxane were loaded into a 500-ml recovery flask. After that, 1.34 g (11.7 mmol) of trans-1,2-cyclohexanediamine were added to the solution, and then the mixture was stirred for 2.5 hr while being heated at a bath temperature of 120° C. After the temperature of the solution had been decreased to room temperature, its solid content was separated by filtration. The resultant filtrate was distilled under reduced pressure. The residue was purified by silica gel column chromatography, to thereby obtain 14.6 g (yield: 91%) of a compound (B-1) as white powder.

Next, under a nitrogen atmosphere, 6.00 g (14.6 mmol) of the compound (B-1), 176 g (623 mmol) of 1-bromo-3-iodobenzene, 5.57 g (29.2 mmol) of copper iodide, and 8.1 g (58.6 mmol) of potassium carbonate were loaded into a 200-ml recovery flask provided with a Dimroth condenser, and were then stirred and dissolved at room temperature. After that, the solution was stirred for 7.5 hr while being heated at a bath temperature of 190° C. After the temperature of the solution had been decreased to room temperature, its solid content was separated by filtration and then excessive 1-bromo-3-iodobenzene was removed by distillation under reduced pressure. Thus, 15.1 g of a crude product were obtained. The crude product was purified by silica gel column chromatography and then recrystallized twice with dichloromethane/hexane to provide 3.0 g of a compound (B-2) (yield: 83%).

Under a nitrogen atmosphere, 2.87 g (5.07 mmol) of the resultant compound (B-2) were loaded into a 200-ml recovery flask. Next, 3.1 g (12.21 mmol) of bispinacolatodiboron, 1.50 g (15.27 mmol) of potassium acetate, and 100 ml of 1,4-dioxane were loaded into the flask, and then the mixture was stirred at a bath temperature of 60° C. for 30 min. 0.25 g (0.31 mmol) of a (1,1'-bis(diphenylphosphinoferrocene)) dichloropalladium(II) dichloromethane complex was loaded into the flask, and then the mixture was stirred for 6.5 hr while being heated at a bath temperature of 80° C. Further, 1.55 g (6.1 mmol) of bispinacolatodiboron and 0.25 g (0.31 mmol) of the (1,1'-bis(diphenylphosphinoferrocene))dichloropalladium(II) dichloromethane complex were additionally added twice to the mixture, and the whole was stirred for 40 hr while being heated. After the temperature of the resultant had been decreased to room temperature, its solid content was separated by filtration and then 1,4-dioxane was removed by distillation under reduced pressure. The residue was purified by silica gel column chromatography to provide 3.00 g of the compound (A-2) (yield: 90%).

The $^1$H-NMR and FD-MS spectrum of the compound (A-2) are shown below.

$^1$H-NMR (400 MHz, CDCl$_3$): δ (ppm); 8.12-8.17 (3H, m), 8.077 (1H, dt, J=8, 2 Hz), 8.002 (1H, br d, J=2 Hz), 7.949 (1H, ddd, J=1, 2, 7 Hz), 7.63-7.67 (4H, m), 7.19-7.33 (6H, m), 6.766 (1H, ddd, J=2, 7, 8 Hz), 5.935 (1H, d, J=8 Hz), 1.352 (12H, s), 1.261 (12H, s) FD-MS spectrum: 660 (M+, base)

Meanwhile, under a nitrogen atmosphere, 32.4 g (0.31 mmol) of a compound (B-3) were loaded into a 2,000-ml recovery flask. Further, 75.3 g (175 mmol) of phenyliodine bis(trifluoroacetate), 41.9 g (165 mmol) of iodine, and 600 ml of carbon tetrachloride were loaded into the flask, and then the mixture was stirred for 2 hr while being heated at a bath temperature of 50° C. After the temperature of the mixture had been decreased to room temperature, carbon tetrachloride was removed by distillation under reduced pressure. The addition of EtOH to the residue resulted in the precipitation of a solid and the solid was separated by filtration. The solid was recrystallized with EtOH twice and then dried to provide 35.8 g of the compound (B-4) (yield: 48%).

The compound (A-2) and the compound (B-4) were polymerized to synthesize the polymer (P-1). Specifically, 0.66 g (1.0 mmol) of the compound (A-2) and 0.44 g (1.00 mmol) of the compound (B-4) were dissolved in 20 ml of toluene, and then 10 mg of tetrakistriphenylphosphine palladium(0) as a catalyst and 10 ml of a 2 M aqueous solution of Na$_2$CO$_3$ were added to the solution. After a nitrogen purge, the mixture was subjected to a reaction at 70° C. for 3.5 hr. After the temperature of the reaction liquid had been decreased to room temperature, the aqueous layer was separated from the reaction liquid. After that, 243 mg (2 mmol) of phenylboronic acid, 314 mg (2 mmol) of bromobenzene, and 10 mg of tetrakistriphenylphosphine palladium(0) were loaded into the remainder, and then terminal sealing was performed by subjecting the mixture to a reaction at a bath temperature of 90° C. for 20 hr. After the temperature of the resultant had been decreased to room temperature, the resultant was purified by reprecipitation with MeOH. The purified polymer component was collected and fed to MeOH again to perform reslurrying repetitively, to thereby obtain 0.40 g of the polymer (P-1). The resultant polymer was identified by GPC, TGA, and DSC. The polymer had an Mw in terms of polystyrene of 4,700 as measured by GPC (tetrahydrofuran: THF) and a molecular weight distribution of 1.8.

Example 2

An element including the polymer (P-1) obtained in Example was evaluated. First, a film of poly(3,4-ethylenedioxythiophene)/polystyrene sulfonic acid (PEDOT/PSS): (manufactured by H. C. Starck, product name: Clevios PCH8000) was formed as a hole-injecting layer at a thickness of 25 nm on a glass substrate with ITO having a thickness of 150 nm, which had been washed with a solvent and treated by UV and ozone. Next, the synthesized polymer (P-1) was dissolved in THF to prepare a 0.4 wt. % solution, and a film having a thickness of 20 nm was formed as a hole-transporting layer by a spin coating method. Next, a film of a light-emitting layer having a thickness of 40 nm was formed by co-evaporation using tris(2-(p-tolyl)pyridine)iridium (III) as a light-emitting layer dopant and using 4,4'-bis(9H-carbazol-9-yl)biphenyl as a light-emitting layer host by a vacuum deposition apparatus at a dopant concentration of 0.6 wt %. After that, a film of tris(8-hydroxyquinolinato)aluminum ($Alq_3$) having a thickness of 35 nm and a film of LiF/Al having a thickness of 170 nm as a cathode were formed using the vacuum deposition apparatus. The element was sealed in a glove box, to thereby produce an organic electroluminescent element.

An external power supply was connected to the organic electroluminescent element thus obtained, and a DC voltage of 0 to 10 V was applied thereto. As a result, the element was found to have light emission properties as shown in Table 1. The values for luminance, voltage, and luminous efficiency shown in the table are values when the element is driven at 20 mA/cm$^2$. It should be noted that the maximum wavelength of the light emission spectrum of the element was 550 nm, and green light emission derived from the iridium complex was observed.

Example 3

A polymer (P-2) was obtained in the same manner as in Example 1 except that 0.66 g (1.0 mmol) of the compound (A-2) and 0.40 g (0.9 mmol) of the compound (B-4) were used in subjecting the compound (A-2) and the compound (B-4) to polymerization. The polymer had an Mw of 2,500 and a molecular weight distribution of 1.5. In addition, element evaluations were performed in the same manner as in Example 2.

Example 4

A polymer (P-3) is synthesized from the compound (A-2) and 1,3-diiodobenzene according to the following scheme.

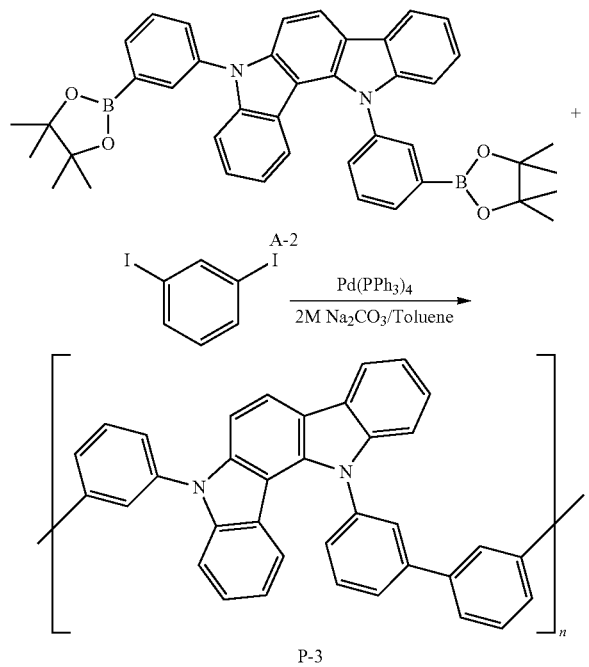

Specifically, the polymer (P-3) was obtained in the same manner as in Example 1 except that materials were changed to 0.66 g (1.0 mmol) of the compound (A-2) and 0.33 g (1.0 mmol) of 1,3-diiodobenzene. The polymer had an Mw of 7,500 and a molecular weight distribution of 2.2. In addition, element evaluations were performed in the same manner as in Example 2.

Example 5

According to the following scheme, a compound (B-5) is synthesized, and then a polymer (P-4) is synthesized from the compound (A-2) and the compound (B-5).

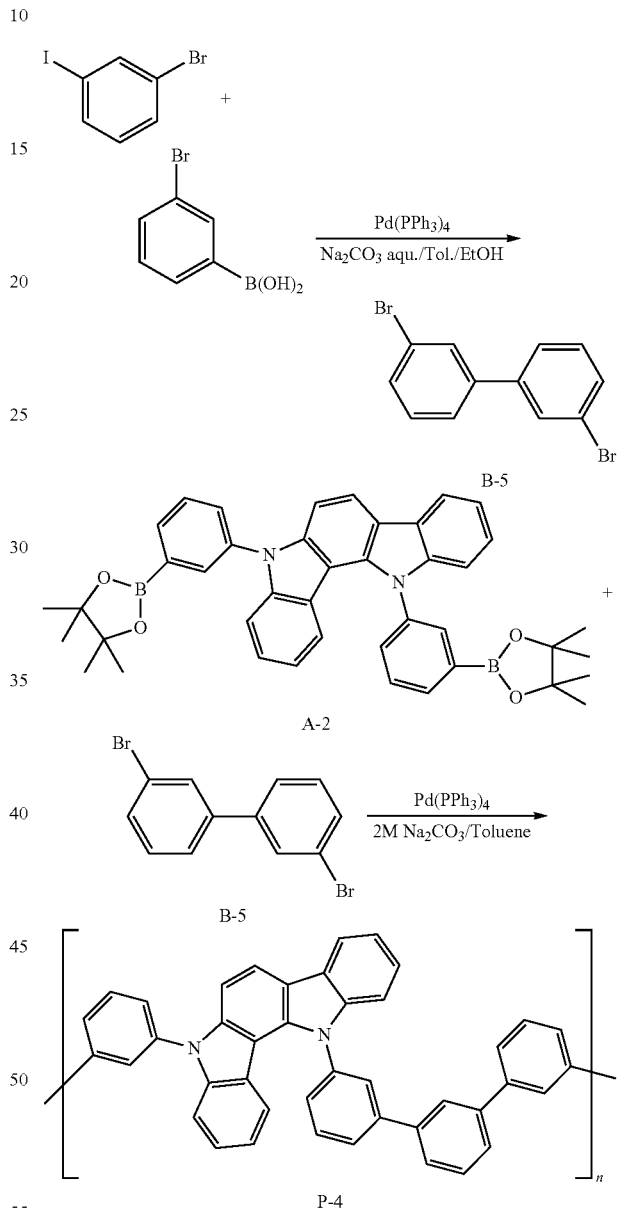

50.0 g (177 mmol) of 1-bromo-3-iodobenzene, 35.5 g (177 mmol) of m-bromophenylboronic acid, 3.37 g (2.92 mmol) of triphenylphosphine palladium(0), 600 ml of toluene, and 225 ml of EtOH were loaded into a 2-L four-necked recovery flask equipped with a temperature gage, a reflux tube, and a nitrogen inlet tube, and were dissolved. After a nitrogen purge, 112.4 g (1.06 mol) of sodium carbonate and 300 ml of pure water were added to the solution, and then the mixture was stirred for 6 hr while being heated at a bath temperature of 100° C. After the temperature of the mixture had been decreased to room temperature, the mixture was transferred to a separating funnel, followed by oil-water separation. After the organic layer had been washed, the layer was dehydrated with anhydrous magnesium sulfate and then the solvent was removed by distillation under reduced pressure. Thus, 62.1 g of a crude product were obtained. The crude product was distilled under reduced pressure to provide 44.8 g of the compound (B-5) (yield: 81%).

Next, the polymer (P-4) was obtained in the same manner as in Example 1 except that materials were changed to 0.66 g (1.0 mmol) of the compound (A-2) and 0.31 g (1.0 mmol) of the compound (B-5). The polymer had an Mw of 3,500 and a molecular weight distribution of 1.7. In addition, element evaluations were performed in the same manner as in Example 2.

Example 6

A polymer (P-5) is synthesized from the compound (A-2) and bis(4-bromophenyl)ether according to the following scheme.

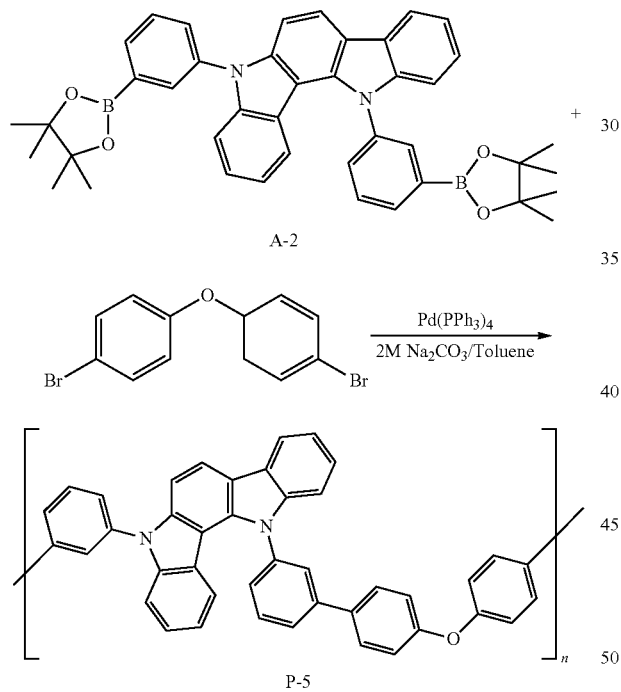

0.10 g of the polymer (P-5) was obtained by performing polymerization and a post-treatment in the same manner as in Example 1 except that 0.66 g (1.0 mmol) of the compound (A-2) and 0.33 g (1.0 mmol) of bis(4-bromophenyl)ether were used. The polymer had an Mw of 5,200 and a molecular weight distribution of 1.9. In addition, element evaluations were performed in the same manner as in Example 2.

Example 7

A polymer (P-6) is synthesized from the compound (A-2) and N-butylphenyl-N,N'-bisdibromodiphenylamine according to the following scheme.

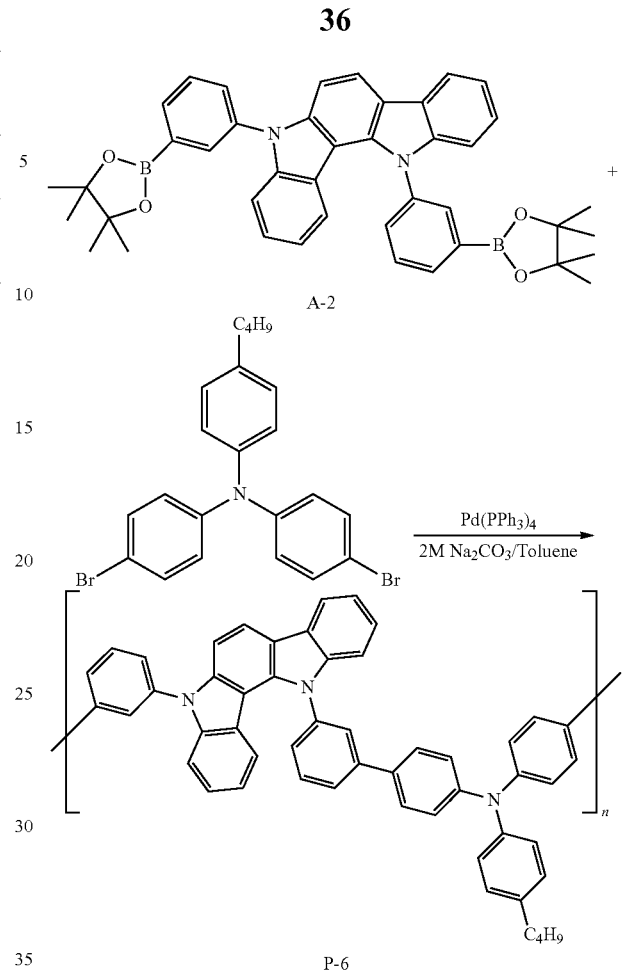

0.33 g of the polymer (P-6) was obtained by performing polymerization and a post-treatment in the same manner as in Example 1 except that 0.66 g (1.0 mmol) of the compound (A-2) and 0.46 g (1.0 mmol) of N-butylphenyl-N,N-bisdi-bromodiphenylamine were used. The polymer had an Mw of 15,000 and a molecular weight distribution of 1.9. In addition, element evaluations were performed in the same manner as in Example 2.

Example 8

A polymer (P-7) is synthesized from the compound (A-3) and the compound (B-4) according to the following scheme.

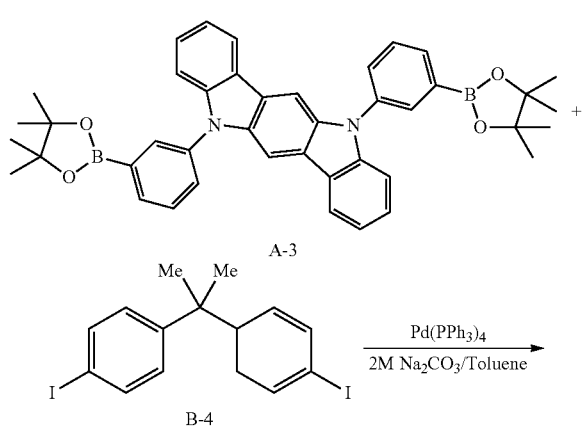

-continued

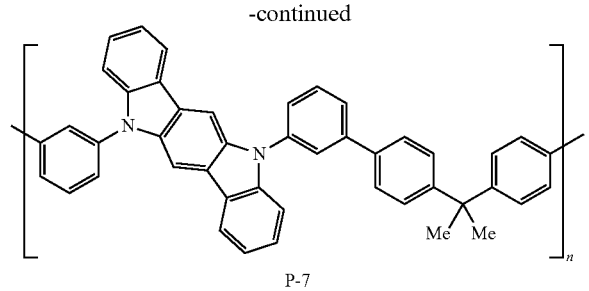

P-7

0.32 g of the polymer (P-7) was obtained by performing polymerization and a post-treatment in the same manner as in Example 1 except that the compound (A-1) was changed to 0.66 g (1.0 mmol) of the compound (A-3). The polymer had an Mw of 5,200 and a molecular weight distribution of 1.8. In addition, element evaluations were performed in the same manner as in Example 2.

Example 9 (for Comparison)

A polymer (EP-1) is synthesized using the compound (C-1) according to the following scheme.

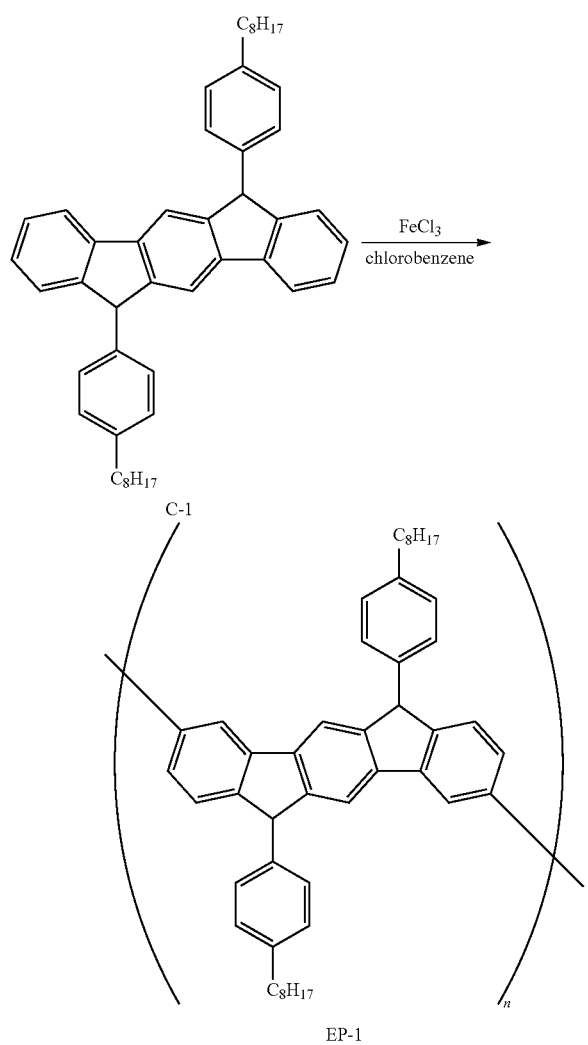

0.7 g (4.3 mmol) of iron(III) chloride and 20 ml of monochlorobenzene were loaded into a 50-ml recovery flask and nitrogen purging was performed. After that, 10 ml of a solution prepared in advance by dissolving 0.7 g (1.1 mmol) of a compound (C-1) in monochlorobenzene were added and polymerization was performed at a bath temperature of 50° C. for 44 hr. The polymerization solution was purified by reprecipitation with methanol. The purified polymer component was collected, transferred to a recovery flask, and 20 ml of 5% ammonia water were loaded into the flask, followed by stirring. The precipitate was filtered, repeatedly washed twice with 50 ml of pure water and three times with 50 ml of MeOH, and dried to provide 0.67 g of the polymer (EP-1). The polymer had an Mw of 4,200 and a molecular weight distribution of 1.5. In addition, element evaluations were performed in the same manner as in Example 2.

The HOMO energy value of 4,4'-bis(9H-carbazol-9-yl)biphenyl as a host material and the HOMO energy value of a trimer unit of each of the polymers P-1, P-3, P-6, and EP-1 were calculated with the Gaussian 03 by structural optimization calculation at the B3LYP/6-31G* level, and then a difference between the host material and each polymer was calculated. Table 1 shows each difference.

TABLE 1

|  | Difference in HOMO energy (eV) |
|---|---|
| P-1 | 0.36 |
| P-3 | 0.31 |
| P-6 | 0.40 |
| EP-1 | 0.84 |

Table 2 shows the polymers used for the element evaluations and the results of the evaluations. All the polymers are ones used in the hole-transporting layers. It should be noted that the maximum wavelength of the light emission spectrum of the element was 550 nm, and green light emission derived from the iridium complex was observed.

TABLE 2

|  | Polymer | Mw (×10$^4$) | Luminance (cd/m$^2$) | Voltage (V) | Luminous efficiency (lm/W) |
|---|---|---|---|---|---|
| Example2 | P-1 | 4,700 | 5,200 | 8.1 | 10.1 |
| Example3 | P-2 | 2,500 | 4,900 | 8.3 | 9.3 |
| Example4 | P-3 | 7,500 | 5,000 | 7.9 | 9.9 |
| Example5 | P-4 | 3,500 | 4,800 | 8.0 | 9.4 |
| Example6 | P-5 | 5,200 | 4,500 | 8.1 | 8.7 |
| Example7 | P-6 | 15,000 | 5,500 | 8.0 | 10.8 |
| Example8 | P-7 | 5,200 | 5,400 | 8.4 | 10.1 |
| Example9 | EP-1 | 4,200 | 3,600 | 9.1 | 6.2 |

INDUSTRIAL APPLICABILITY

When the polymer for an organic electroluminescent element of the present invention is used, an organic electroluminescent element having improved hole-injecting property and excellent luminous efficiency can be obtained. In addition, a large-area element can be easily formed by a coating film formation method or the like.

The invention claimed is:
1. A polymer for an organic electroluminescent element, comprising a repeating unit represented by the following general formula (1) in repeating units constituting a main chain:

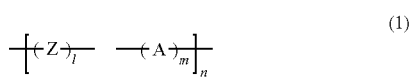 (1)

where Z represents one or two or more kinds of repeating units selected from groups derived from indolocarbazoles represented by the following formulae (1a) to (1e), A represents one or two or more kinds of repeating units represented by the following formula (4a) or (4b) and different from Z, l and m each represent an abundance molar ratio, and when a ratio of all repeating units is defined as 100 mol %, l is 10 to 90 mol % and m is 10 to 90 mol %, and n represents an average repetition number and is 5 to 1,000;

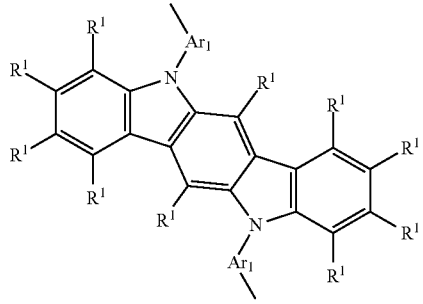 (1a)

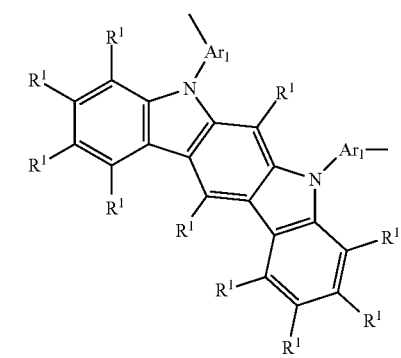 (1b)

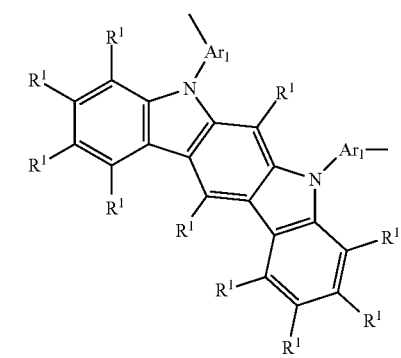 (1c)

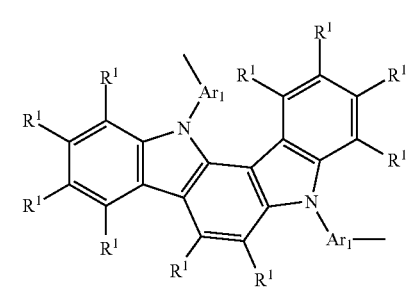 (1c)

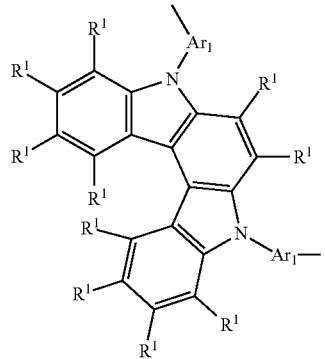 (1d)

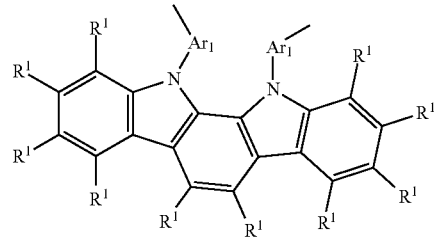 (1e)

in the formulae (1a) to (1e), $Ar_1$'s each independently represent a substituted or unsubstituted $C_6$ to $C_{18}$ arylene group, or a substituted or unsubstituted $C_3$ to $C_{18}$ heteroarylene group, and $R^1$'s each independently represent hydrogen, a $C_1$ to $C_{12}$ alkyl group, a $C_1$ to $C_{12}$ alkoxy group, a $C_6$ to $C_{18}$ aryl group, a $C_6$ to $C_{18}$ aryloxy group, a $C_7$ to $C_{30}$ arylalkyl group, a $C_7$ to $C_{30}$ arylalkyloxy group, a $C_3$ to $C_{18}$ heteroaryl group, a $C_3$ to $C_{18}$ heteroaryloxy group, or a $C_3$ to $C_{18}$ cycloalkyl group;

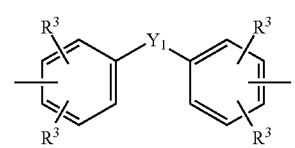 (4a)

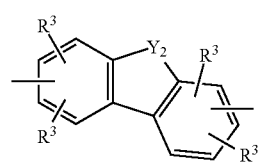 (4b)

where $Y_1$ represents a substituted or unsubstituted $C_1$ to $C_6$ alkylene group, O, or S, $Y_2$ represents a $C(R^4)_2$ group, or O, $R^3$'s each independently represent hydrogen, a $C_1$ to $C_{12}$ alkyl group, a $C_1$ to $C_{12}$ alkoxy group, a $C_6$ to $C_{18}$ aryl group, a $C_6$ to $C_{18}$ aryloxy group, a $C_7$ to $C_{30}$ arylalkyl group, a $C_7$ to $C_{30}$ arylalkyloxy group, a $C_3$ to $C_{18}$ heteroaryl group, a $C_3$ to $C_{18}$ heteroaryloxy group, or a $C_3$ to $C_{18}$ cycloalkyl group, and $R^4$ represents a hydrogen atom, a $C_1$ to $C_{12}$ alkyl group, a $C_3$ to $C_{18}$ cycloalkyl group, a $C_6$ to $C_{18}$ aryl group, a $C_7$ to $C_{30}$ arylalkyl group, a $C_3$ to $C_{18}$ heteroaryl group, or a $C_4$ to $C_{30}$ heteroarylalkyl group.

2. A polymer for an organic electroluminescent element according to claim 1, wherein in the formulae (1a) to (1e), $Ar_1$'s each independently represent a group represented by the following formula (2):

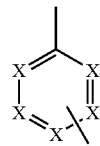
(2)

where X's each independently represent any one of N or C-L, L's each independently represent a hydrogen atom, a $C_6$ to $C_{18}$ aryl group, a $C_3$ to $C_{18}$ heteroaryl group, a $C_{12}$ to $C_{36}$ diarylamino group, or a bonding hand, and one of L's represents a bonding hand.

3. A polymer for an organic electroluminescent element according to claim 1, wherein the polymer for an organic electroluminescent element has a weight-average molecular weight of 1,000 to 1,000,000.

4. A polymer for an organic electroluminescent element according to claim 1, wherein the polymer for an organic electroluminescent element comprises an alternating copolymer in which A and Z as repeating units in the general formula (1) are alternately bonded.

5. An organic electroluminescent element, comprising, between an anode layer and a cathode layer laminated on a substrate, organic layers including at least a hole-transporting layer, a light-emitting layer, and an electron-transporting layer, wherein at least one of the organic layers contains the polymer for an organic electroluminescent element according to claim 1.

6. An organic electroluminescent element according to claim 5, wherein the organic layer containing the polymer for an organic electroluminescent element comprises the hole-transporting layer.

7. An organic electroluminescent element according to claim 6, wherein:
the light-emitting layer comprises a light-emitting layer containing a guest material and a host material; and
a difference between an HOMO energy of the polymer for an organic electroluminescent element contained in the hole-transporting layer and an HOMO energy of the host material contained in the light-emitting layer is within ±0.5 eV.

8. A polymer for an organic electroluminescent element according to claim 1, wherein A represents one or two or more kinds of repeating units represented by formula (4a) and different from Z.

9. A polymer for an organic electroluminescent element according to claim 1, wherein A represents two or more kinds of repeating units represented by formula (4a) or (4b) and different from Z.

10. A polymer for an organic electroluminescent element according to claim 1, wherein all $R^3$'s represent hydrogen.

11. A polymer for an organic electroluminescent element according to claim 1, wherein in the repeating unit, A represents one or two or more kinds of repeating units represented by the formula (4b) and different from Z.

12. A polymer for an organic electroluminescent element according to claim 1, wherein in the formula (4b), $Y_2$ represents a $C(R^4)_2$ group.

13. A polymer for an organic electroluminescent element according to claim 1, wherein in the formula (4b), $Y_2$ represents an O.

14. A polymer for an organic electroluminescent element, comprising a repeating unit represented by the following general formula (1) in repeating units constituting a main chain:

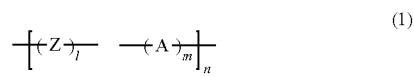
(1)

where Z represents one or two or more kinds of repeating units selected from groups derived from indolocarbazoles represented by the following formulae (1a) to (1e), A represents two or more kinds of repeating units represented by the following formula (4b) and different from Z, 1 and m each represent an abundance molar ratio, and when a ratio of all repeating units is defined as 100 mol %, 1 is 10 to 90 mol % and m is 10 to 90 mol %, and n represents an average repetition number and is 5 to 1,000;

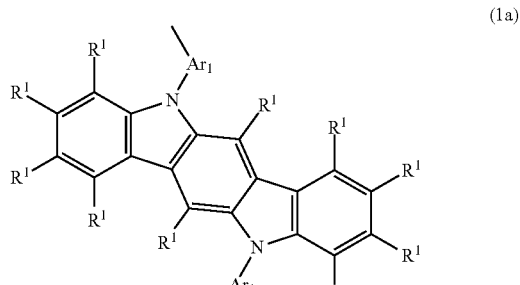
(1a)

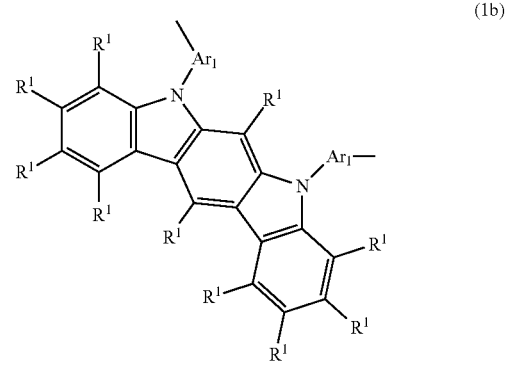
(1b)

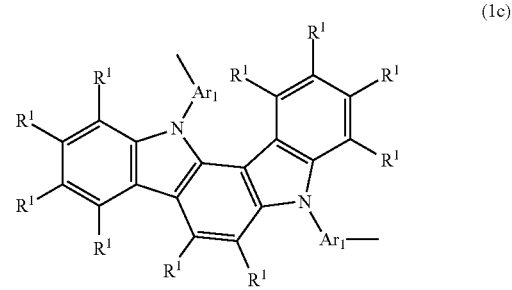
(1c)

-continued

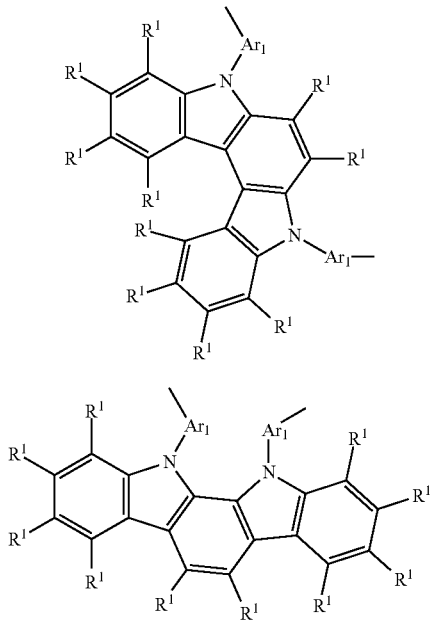

(1d)

(1e)

in the formulae (1a) to (1e), $Ar_1$'s each independently represent a substituted or unsubstituted $C_6$ to $C_{18}$ arylene group, or a substituted or unsubstituted $C_3$ to $C_{18}$ heteroarylene group, and $R^1$'s each independently represent hydrogen, a $C_1$ to $C_{12}$ alkyl group, a $C_1$ to $C_{12}$ alkoxy group, a $C_6$ to $C_{18}$ aryl group, a $C_6$ to $C_{18}$ aryloxy group, a $C_7$ to $C_{30}$ arylalkyl group, a $C_7$ to $C_{30}$ arylalkyloxy group, a $C_3$ to $C_{18}$ heteroaryl group, a $C_3$ to $C_{18}$ heteroaryloxy group, or a $C_3$ to $C_{18}$ cycloalkyl group;

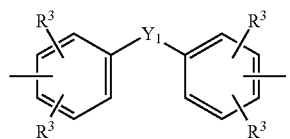

(4a)

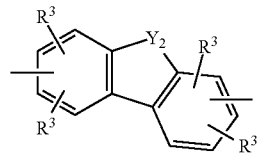

(4b)

where $Y_1$ represents a substituted or unsubstituted $C_1$ to $C_6$ alkylene group, an $N-R^4$ group, O, S or a single bond, $Y_2$ represents a $C(R^4)_2$ group, O, or S, $R^3$'s each independently represent hydrogen, a $C_1$ to $C_{12}$ alkyl group, a $C_1$ to $C_{12}$ alkoxy group, a $C_6$ to $C_{18}$ aryl group, a $C_6$ to $C_{18}$ aryloxy group, a $C_7$ to $C_{30}$ arylalkyl group, a $C_7$ to $C_{30}$ arylalkyloxy group, a $C_3$ to $C_{18}$ heteroaryl group, a $C_3$ to $C_{18}$ heteroaryloxy group, or a $C_3$ to $C_{18}$ cycloalkyl group, and $R^4$ represents a hydrogen atom, a $C_1$ to $C_{12}$ alkyl group, a $C_3$ to $C_{18}$ cycloalkyl group, a $C_6$ to $C_{18}$ aryl group, a $C_7$ to $C_{30}$ arylalkyl group, a $C_3$ to $C_{18}$ heteroaryl group, or a $C_4$ to $C_{30}$ heteroarylalkyl group.

* * * * *